US00RE48304E

(19) United States
(12) Reissued Patent
Wu et al.

(10) Patent Number: US RE48,304 E
(45) Date of Reissued Patent: Nov. 10, 2020

(54) SOURCE AND DRAIN DISLOCATION FABRICATION IN FINFETS

(71) Applicant: Taiwan Semiconductor Manufacturing Company, Ltd., Hsin-Chu (TW)

(72) Inventors: Zhiqiang Wu, Chubei (TW); Wen-Hsing Hsieh, Hsin-Chu (TW); Hua Feng Chen, Hsin-Chu (TW); Ting-Yun Wu, Taipei (TW); Carlos H. Diaz, Mountain View, CA (US); Ya-Yun Cheng, Taichung (TW); Tzer-Min Shen, Hsin-Chu (TW)

(73) Assignee: Taiwan Semiconductor Manufacturing Company, Ltd., Hsin-Chu (TW)

(21) Appl. No.: 15/299,150

(22) Filed: Oct. 20, 2016

Related U.S. Patent Documents

Reissue of:
(64) Patent No.: 8,866,235
Issued: Oct. 21, 2014
Appl. No.: 13/673,676
Filed: Nov. 9, 2012

(51) Int. Cl.

| | |
|---|---|
| ***H01L 27/088*** | (2006.01) |
| ***H01L 27/12*** | (2006.01) |
| ***H01L 21/324*** | (2006.01) |
| ***H01L 21/265*** | (2006.01) |
| ***H01L 21/762*** | (2006.01) |
| ***H01L 21/8234*** | (2006.01) |
| ***H01L 29/32*** | (2006.01) |
| ***H01L 29/66*** | (2006.01) |
| ***H01L 29/78*** | (2006.01) |

(52) U.S. Cl.
CPC ..... *H01L 21/324* (2013.01); *H01L 21/265* (2013.01); *H01L 21/76224* (2013.01); *H01L 21/823418* (2013.01); *H01L 21/823431* (2013.01); *H01L 21/823487* (2013.01); *H01L 27/0886* (2013.01); *H01L 29/32* (2013.01); *H01L 29/66795* (2013.01); *H01L 29/7848* (2013.01)

(58) Field of Classification Search
CPC ..... H01L 21/324; H01L 27/0886; H01L 29/7848; H01L 29/66795; H01L 21/76224; H01L 21/823418; H01L 29/32; H01L 21/823487; H01L 21/823431; H01L 21/26
See application file for complete search history.

(56) References Cited

U.S. PATENT DOCUMENTS

| | | | | |
|---|---|---|---|---|
| 7,592,270 | B2 | 9/2009 | Teo et al. | |
| 8,263,451 | B2 * | 9/2012 | Su | H01L 29/785 438/197 |
| 8,809,918 | B2 * | 8/2014 | Lu | H01L 21/76232 257/288 |
| 2006/0292719 | A1 * | 12/2006 | Lochtefeld et al. | 438/22 |
| 2007/0235802 | A1 | 10/2007 | Chong et al. | |
| 2007/0252205 | A1 | 11/2007 | Hoentschel et al. | |
| 2008/0303095 | A1 | 12/2008 | Xiong et al. | |
| 2009/0101978 | A1 * | 4/2009 | Anderson et al. | 257/365 |

(Continued)

*Primary Examiner* — Leonardo Andujar
(74) *Attorney, Agent, or Firm* — Slater Matsil, LLP

(57) ABSTRACT

A device includes a semiconductor fin over a substrate, a gate dielectric on sidewalls of the semiconductor fin, and a gate electrode over the gate dielectric. A source/drain region is on a side of the gate electrode. A dislocation plane is in the source/drain region.

40 Claims, 27 Drawing Sheets

(56) References Cited

U.S. PATENT DOCUMENTS

| | | | | |
|---|---|---|---|---|
| 2009/0325358 | A1* | 12/2009 | Koester | 438/306 |
| 2010/0038685 | A1* | 2/2010 | Weber et al. | H01L 21/26506 257/288 |
| 2010/0301391 | A1* | 12/2010 | Lochtefeld | 257/190 |
| 2011/0101421 | A1* | 5/2011 | Xu | 257/255 |
| 2011/0127610 | A1 | 6/2011 | Lee et al. | |
| 2011/0147842 | A1* | 6/2011 | Cappellani | H01L 21/26506 257/365 |
| 2013/0200455 | A1* | 8/2013 | Lo | H01L 29/66795 257/347 |

* cited by examiner

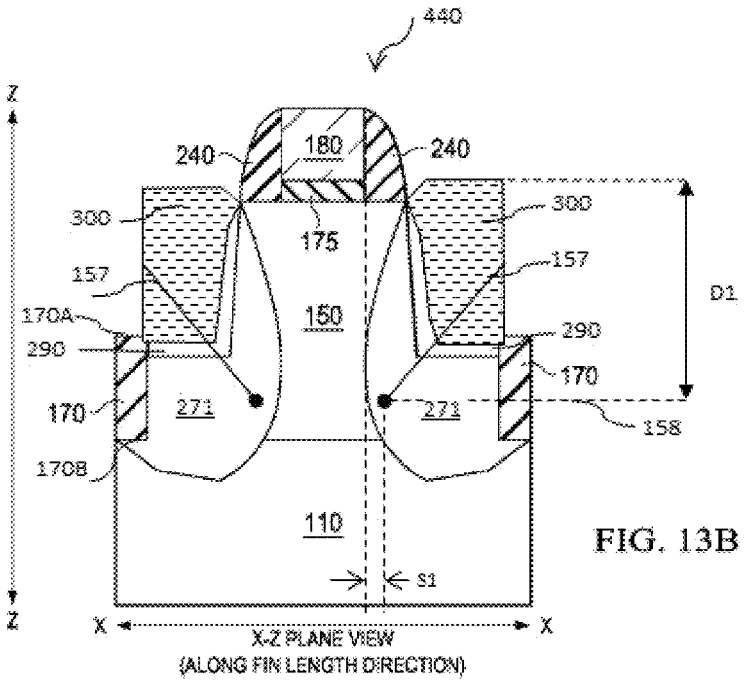
FIG. 13B
Amended
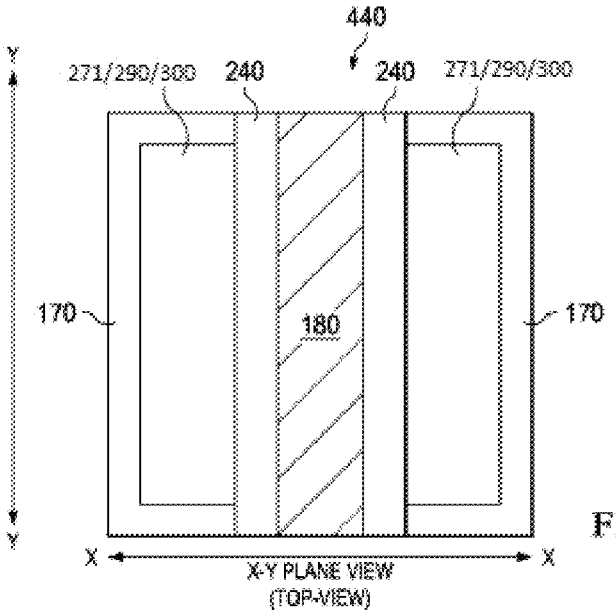
FIG. 13C
Amended

SOURCE AND DRAIN DISLOCATION FABRICATION IN FINFETS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue application of U.S. Pat. No. 8,866,235.*

BACKGROUND

To enhance the performance of metal-oxide-semiconductor (MOS) devices, stresses may be introduced into the channel regions of the MOS devices to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction. Techniques for improving the stresses in the MOS devices are thus explored.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET) with dislocation planes therein and the method of forming the same are provided in accordance with various embodiments. The intermediate stages of forming the FinFET are illustrated.

The variations of the embodiments are discussed. Throughout the various views and illustrative embodiments, like reference numbers are used to designate like elements.

Figure 1:
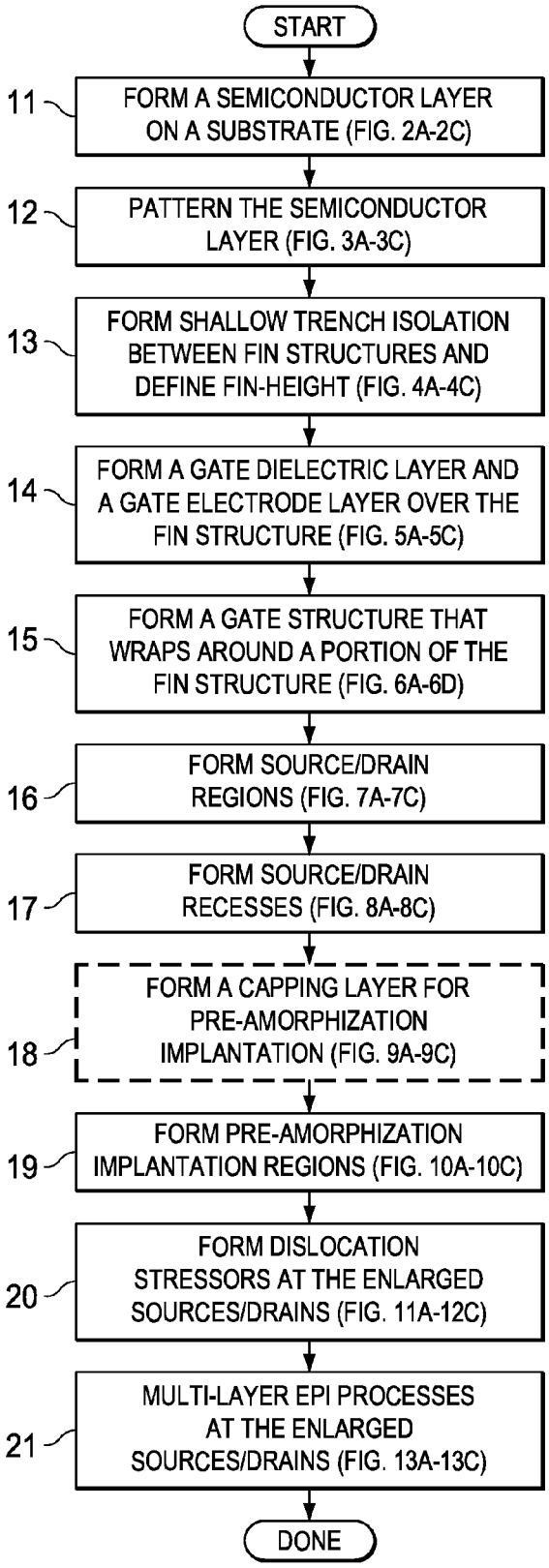
FIG. 1 illustrates a flow chart in the fabrication of a Fin Field-Effect Transistor (FinFET) comprising dislocation planes in source and drain regions.
Figure 12A:
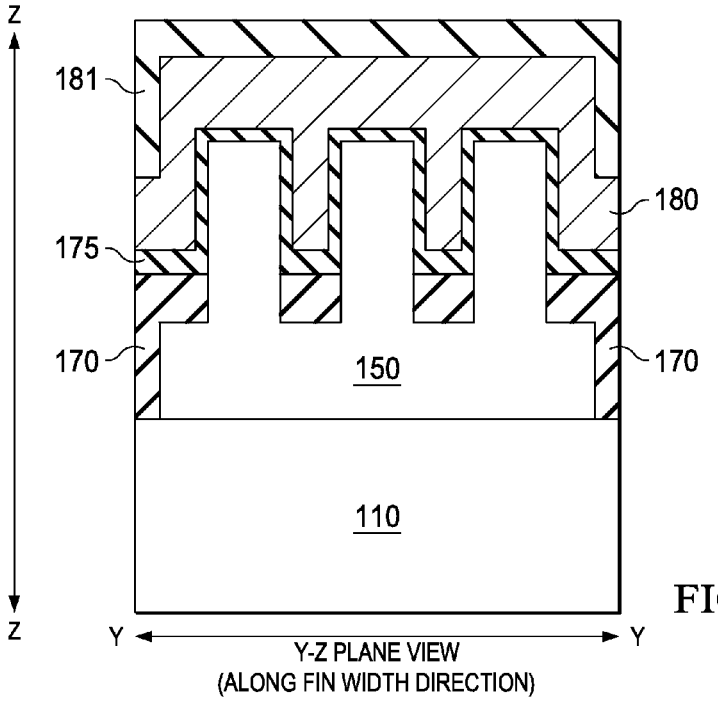
Figure 12B:
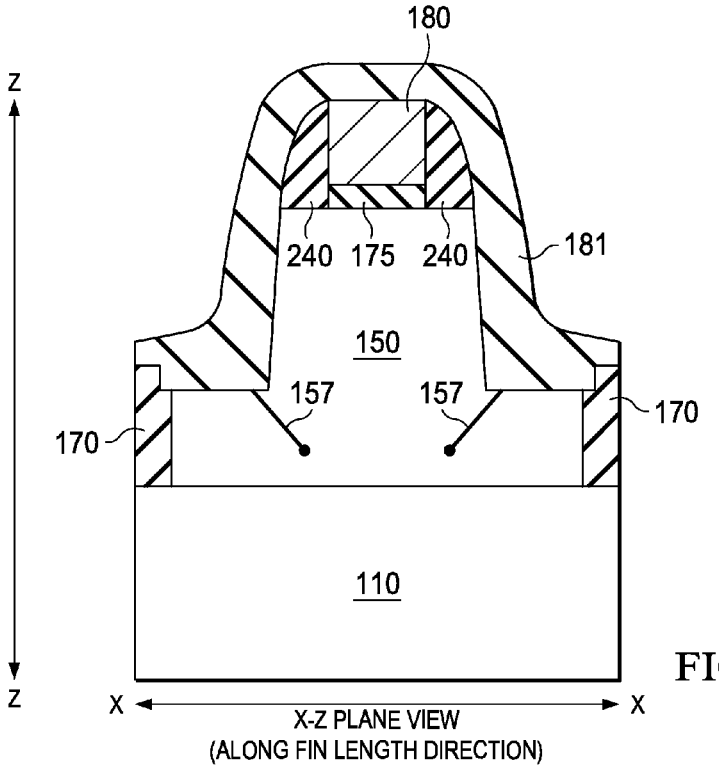
Figure 12C:
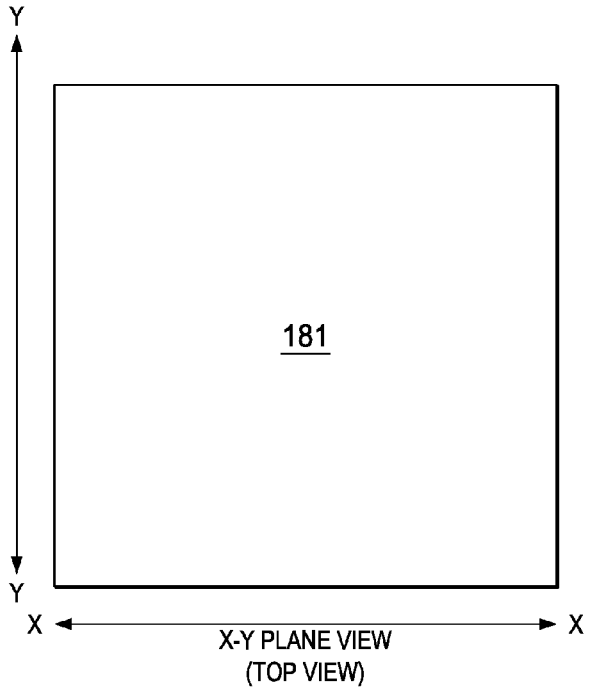
Figure 13A:
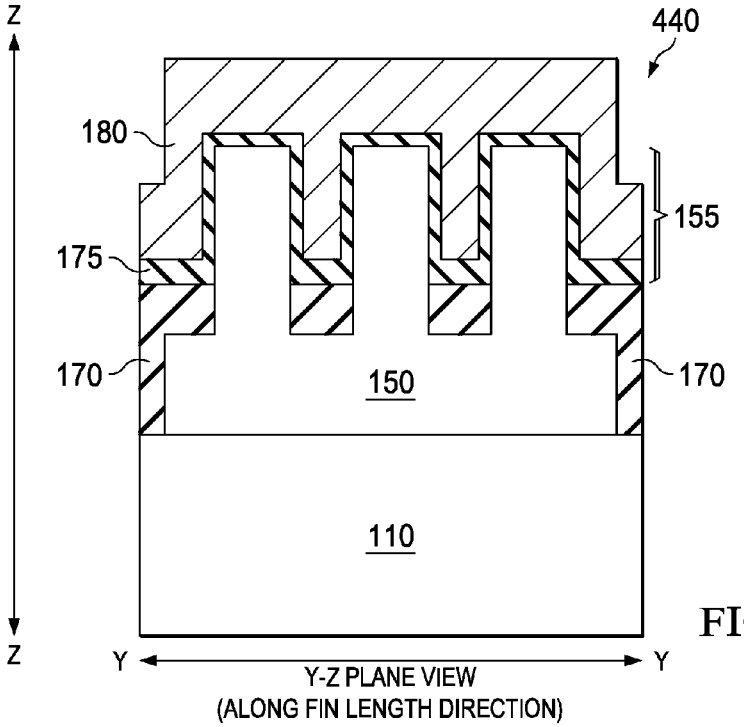
Figure 14A:
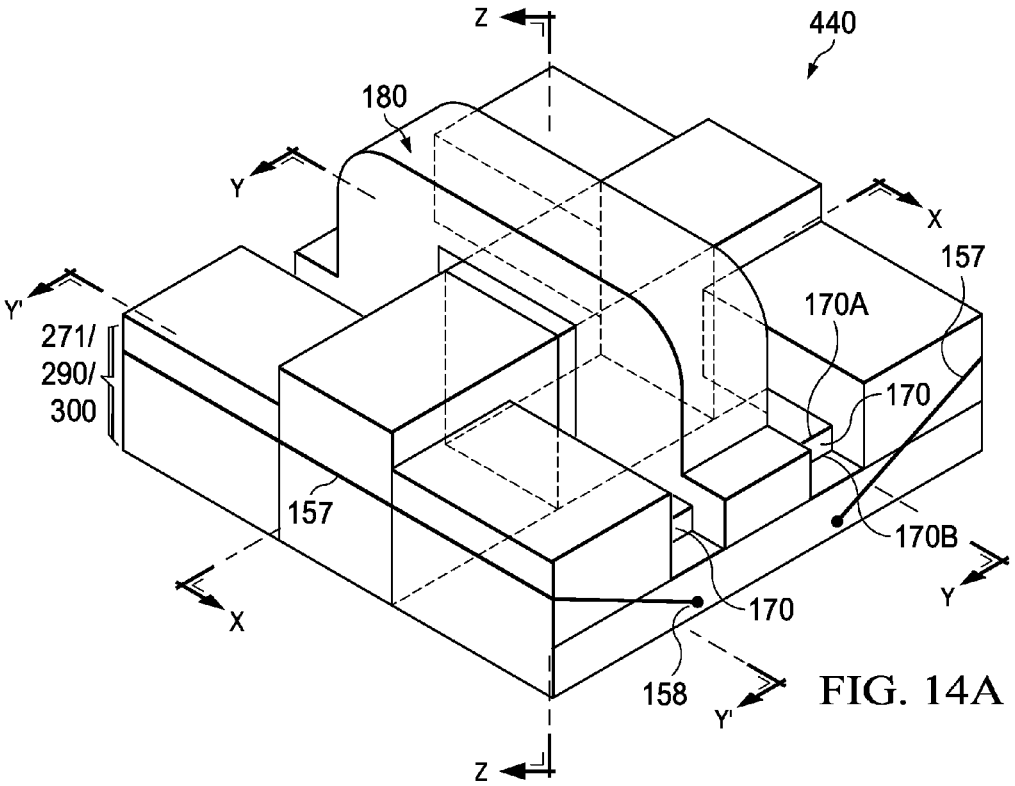
FIGS. 14A and 14B illustrate a perspective view and a cross-sectional view, respectively, of a FinFET in accordance with some exemplary embodiments, wherein source and drain regions and the dislocation planes extend into the regions left by removed Shallow Trench Isolation (STI) regions.

FIG. 1 illustrates a brief process flow for forming FinFET 440, which is illustrated in FIG. 14A (a perspective view), and in FIGS. 13A-13C and 14B (cross-sectional views). FIGS. 15A and 15B illustrate the perspective view and the cross-sectional view, respectively, of FinFETs 440 in accordance alternative embodiments. FIGS. 14A and 15A, lines X-X, Y-Y, and Z-Z, which are perpendicular to each other, are illustrated. Unless specified otherwise, throughout the description, the cross-sectional views in FIGS. 2A through 13C are obtained from the planes crossing lines X-X, Y-Y, and Z-Z in FIGS. 14A and 15A, wherein the cross-sectional views of the figures whose figure numbers include the letter "A" are obtained from the planes formed of lines Y-Y and Z-Z, which planes are referred to as Y-Z planes. The Y-Z planes extend along the fin-width directions. The cross-sectional views of the figures whose figure numbers include the letter "B" are obtained from the planes formed of lines X-X and Z-Z, which planes are referred to as X-Z planes. The X-Z planes extend in the fin-length directions. Unless specified otherwise, the cross-sectional views of the figures whose figure numbers include the letter "C" are obtained from the planes formed of lines X-X and Y-Y, which planes are referred to as X-Y planes. The Figures whose name include letter "C" also illustrate top views. Furthermore, for clarity, each of FIGS. 14A and 15A illustrates that FinFET 440 includes one semiconductor fin, while in reality, each of FinFETs 440 may include a plurality of semiconductor fins, as illustrated the cross-sectional views in FIGS. 14B and 15B.

Figure 2A:
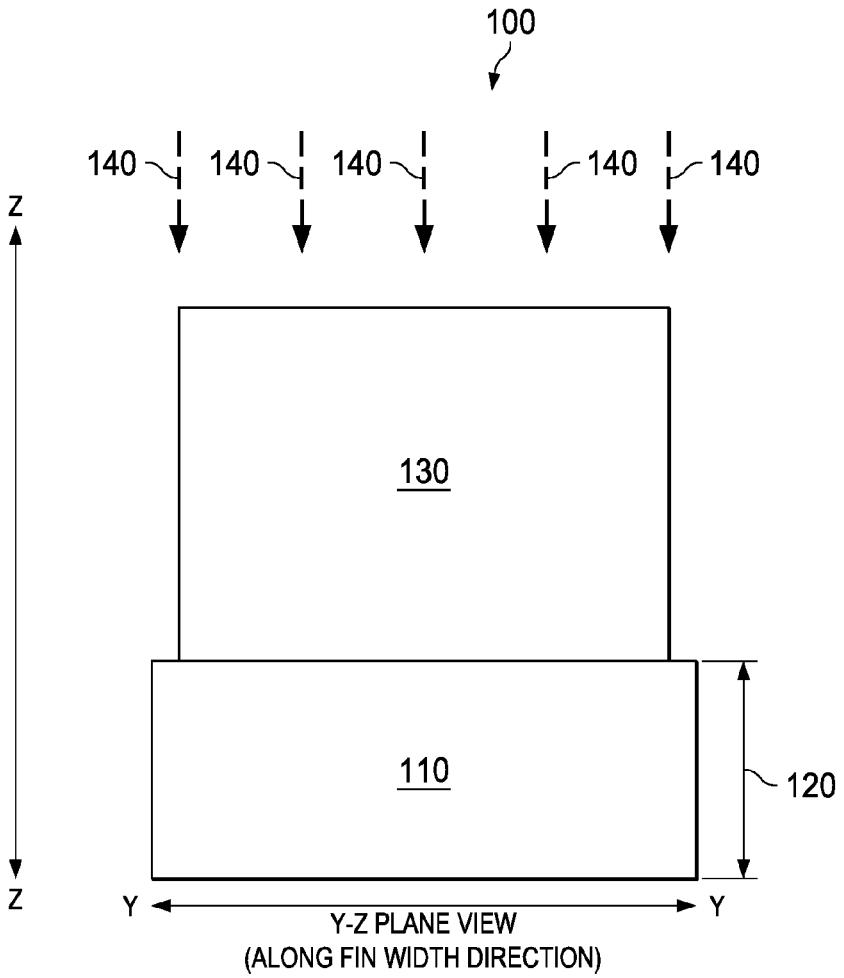
FIGS. 2A through 13C are cross-sectional views, top views, and perspective views of intermediate stages in the manufacturing of FinFET in accordance with some exemplary embodiments.
Figure 2B:
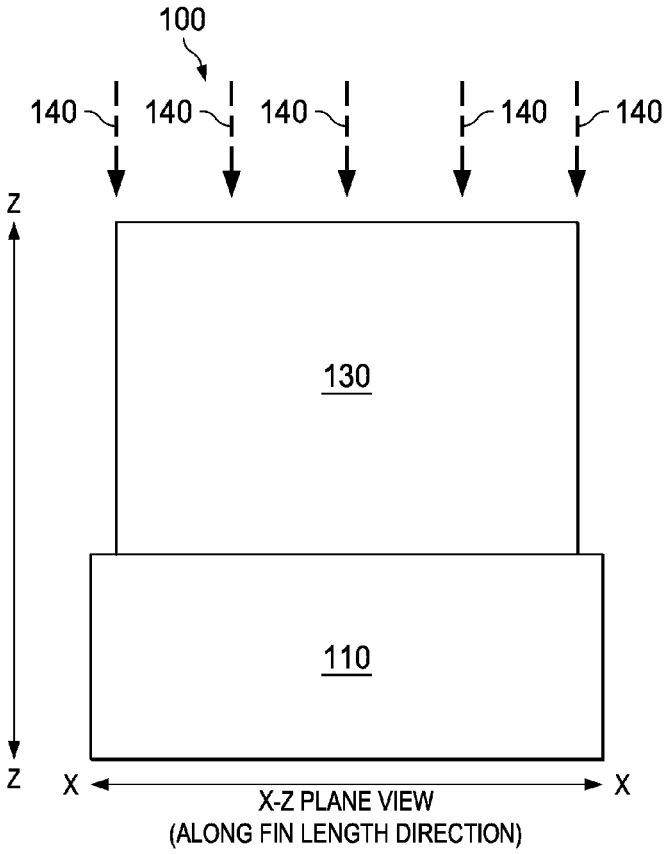
Figure 2C:
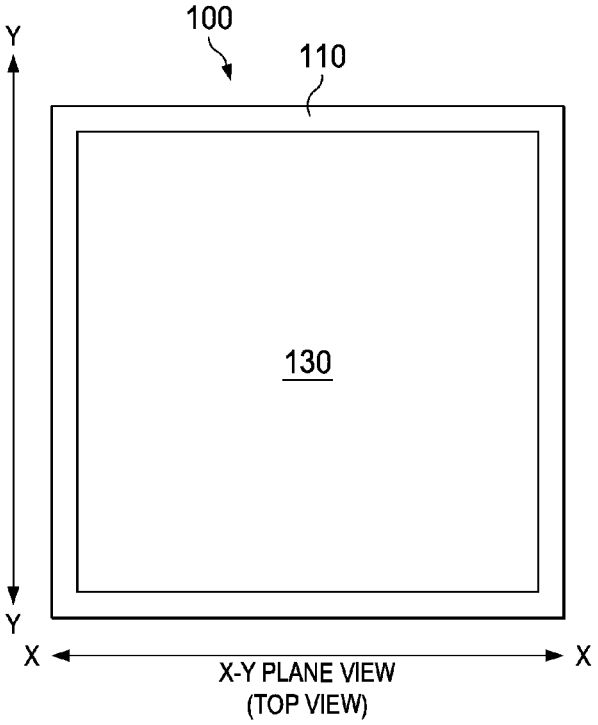

Referring to FIGS. 2A, 2B, and 2C, semiconductor substrate 110, which is a portion of wafer 100, is provided. The respective step is shown as step 11 in FIG. 1. In some embodiments, semiconductor substrate 110 includes silicon. Other commonly used materials such as carbon, germanium, gallium, arsenic, nitrogen, indium, and/or phosphorus may also be included in semiconductor substrate 110. Semiconductor substrate 110 may be a bulk silicon substrate in accordance with some embodiments. A top portion of semiconductor substrate 110 is implanted (arrows 140) to form doped region 130, which implantation step may be used to adjust the threshold voltage of the resulting FinFET 440, and/or form a well region. In some embodiments, the implanted dopant is of p-type (such as B or $BF_2$), and the impurity concentration may be between about $1\times10^{17}/cm^3$ and about $5\times10^{19}/cm^3$. Alternatively, the implanted dopant is of n-type, with the impurity concentration in the similar range. It is appreciated, however, that the values recited throughout the description are merely examples, and may be changed to different values.

Figure 3A:
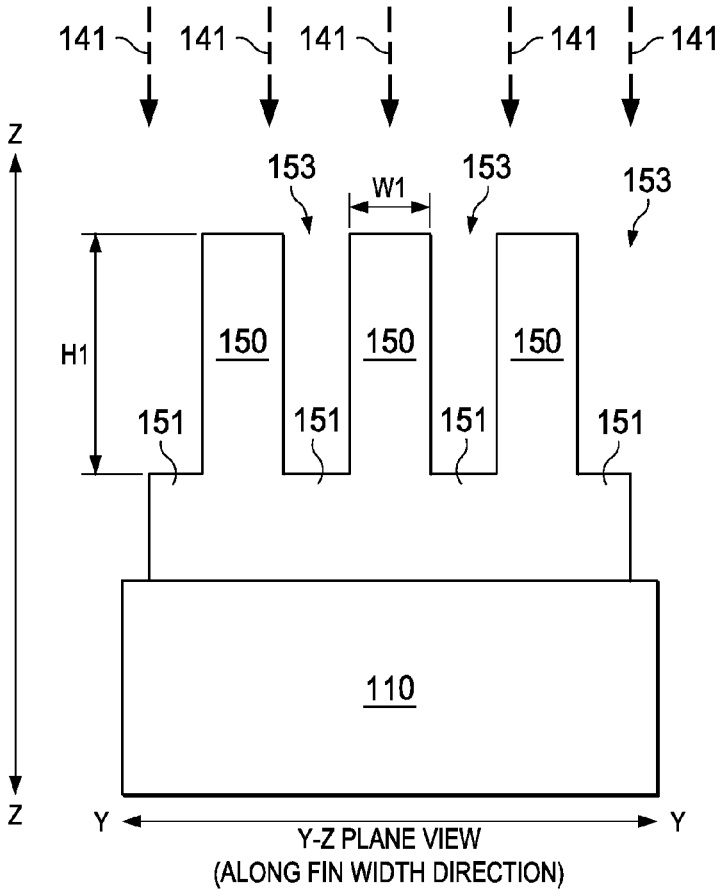
Figure 3B:
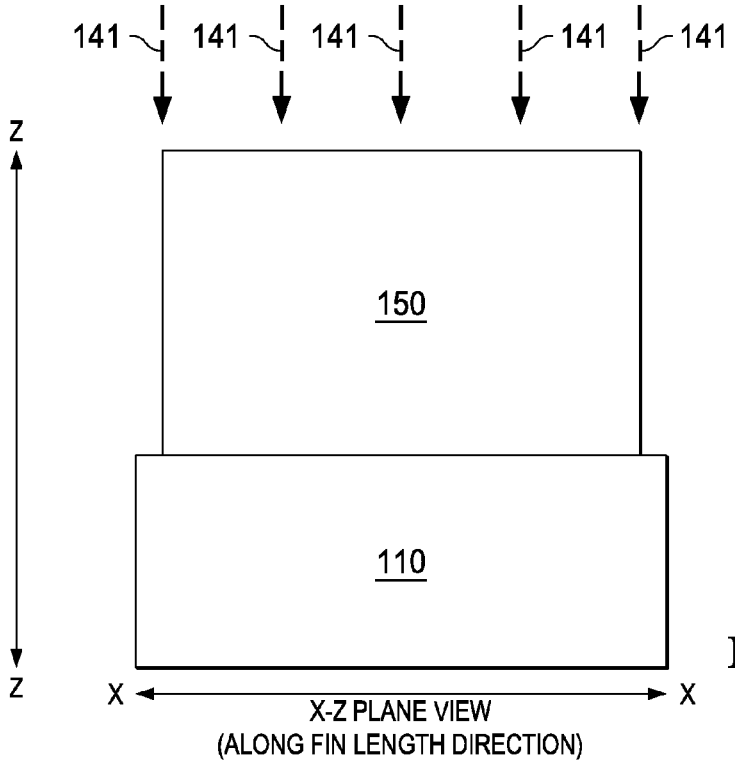
Figure 3C:
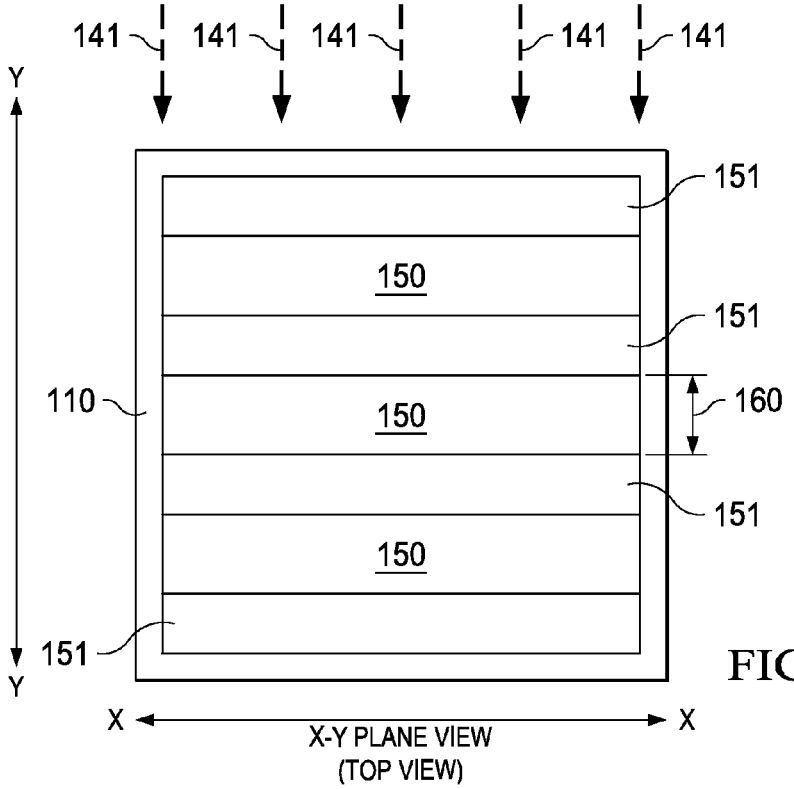

Referring to FIGS. 3A, 3B, and 3C, doped region 130 is etched to form fin structures 150. The respective step is shown as step 12 in FIG. 1. The etching step is represented by arrows 141, which etching step may be an anisotropic etching step, and may also be a dry etching step. Openings 153 are formed between fin structures 150. Fin structures 150 have longitudinal directions in the X directions, which are perpendicular to the illustrated Y and Z directions (also refer to FIG. 3B). In some embodiments, the bottom surfaces of openings 153 are higher than the bottom surface of doped region 130. The portions of doped regions 130 overlapped by openings 153 are referred to as fin-bottom-regions 151 hereinafter. Fin width W1 of fin structures 150 may be between about 2 nm and about 15 nm, or greater than about 15 nm. The fin height is illustrated as H1. Ratio H1/W1 is relatively high, for example, in the range between about 12/1 and about 1/1. In the top view in FIG. 3C, portions 150 and 151 are shown as having alternating patterns.

Figure 4A:
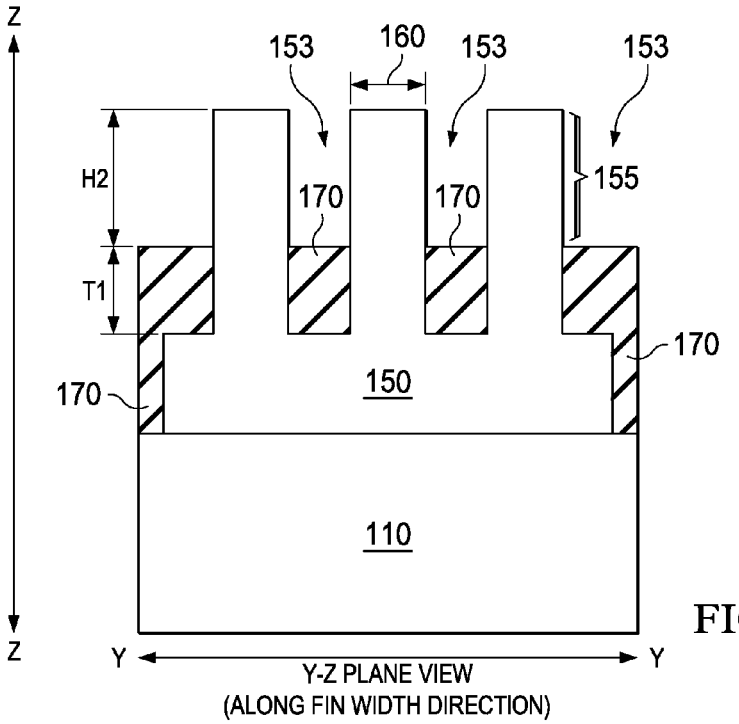
Figure 4B:
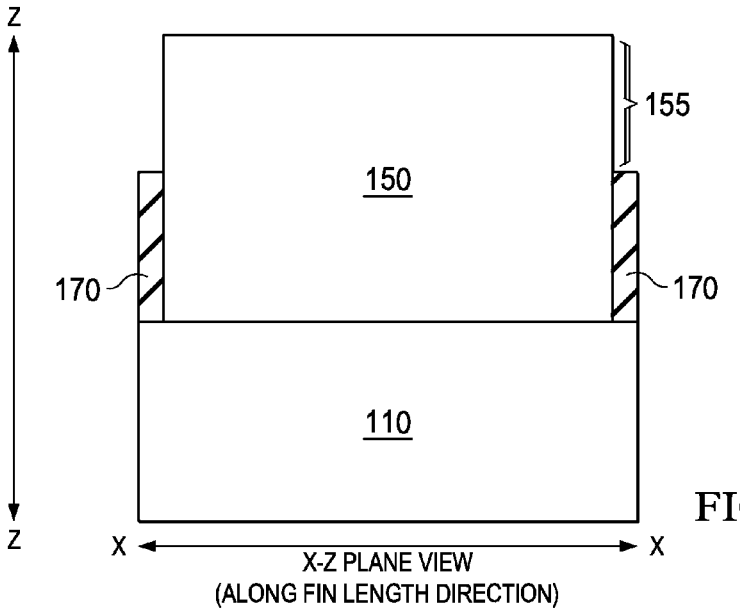
Figure 4C:
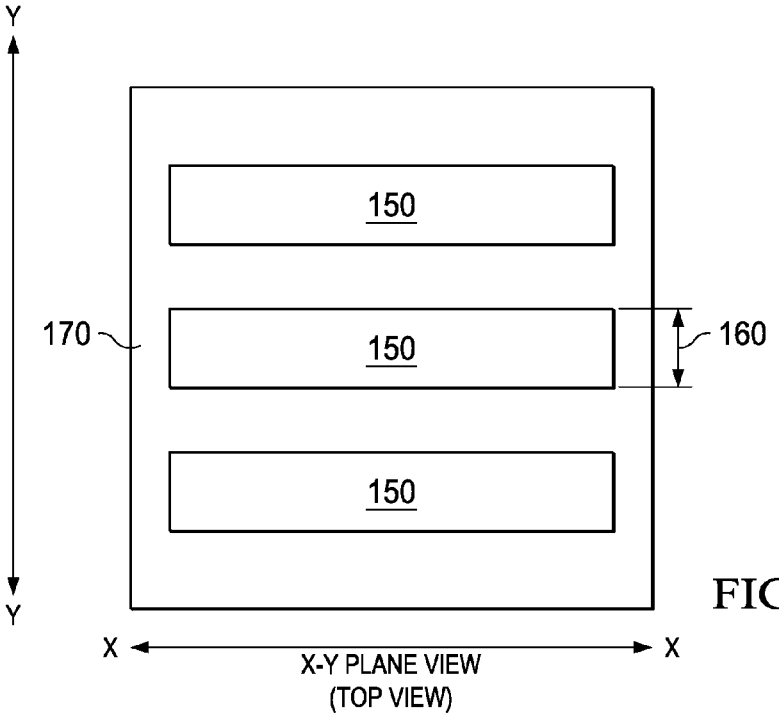

Referring to FIGS. 4A, 4B, and 4C, dielectric layer 170, which may form Shallow Trench Isolation (STI) regions, is formed. Throughout the description, portions of dielectric layer 170 are referred to as STI regions 170. The respective step is shown as step 13 in FIG. 1. STI regions 170 may comprise silicon oxide or other dielectric materials. Thickness T1 of STI regions 170 may be greater than about 3 nm. Thickness T1, however, is also controlled not to be too high, so that some portions of STI regions 170 may be etched through easily in subsequent processes. For example, thickness T1 may be smaller than about 20 nm. In some embodiments, STI regions 170 are formed using a method selected from Chemical Vapor Deposition (CVD), Atomic Layer Deposition (ALD), Physical Vapor Deposition (PVD), and the like. In some exemplary embodiments, the formation of STI regions 170 includes filling the entireties of openings 153 with a dielectric material, performing a Chemical Mechanical Polish (CMP) to level the top surface of the dielectric material, and recessing the dielectric material to form STI regions 170. Throughout the description, the portions of fin structures 150 over the top surface of STI regions 170 are referred to as semiconductor fins 155. As shown in FIGS. 4A and 4C, some lower portions of fin structures 150 are encircled by STI regions 170.

Figure 5A:
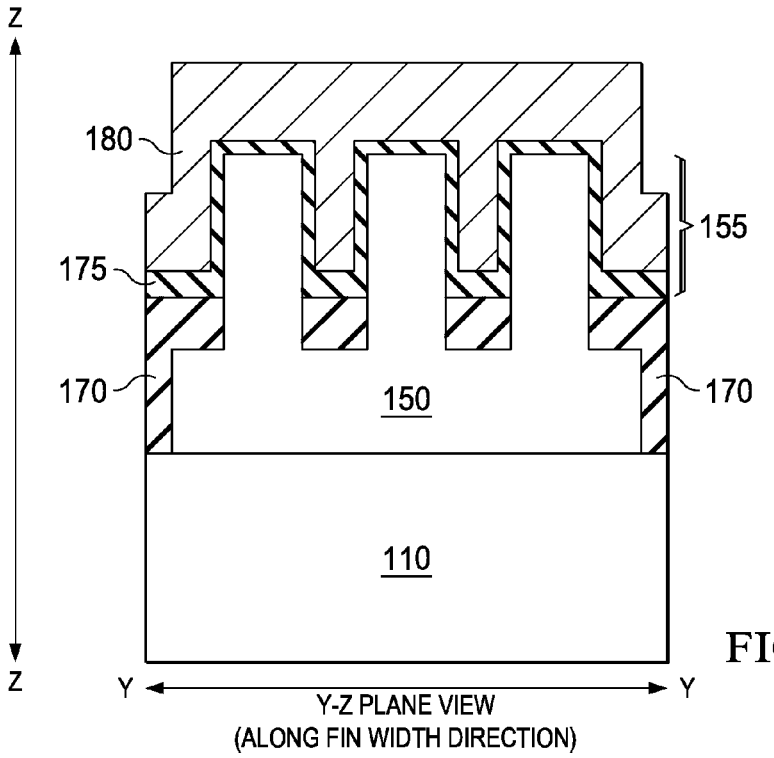
Figure 5B:
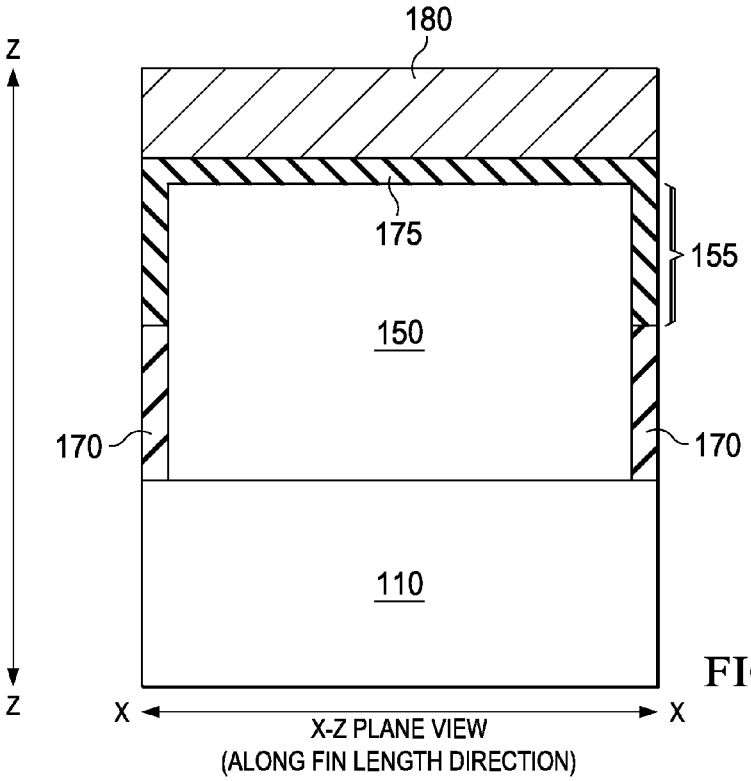
Figure 5C:
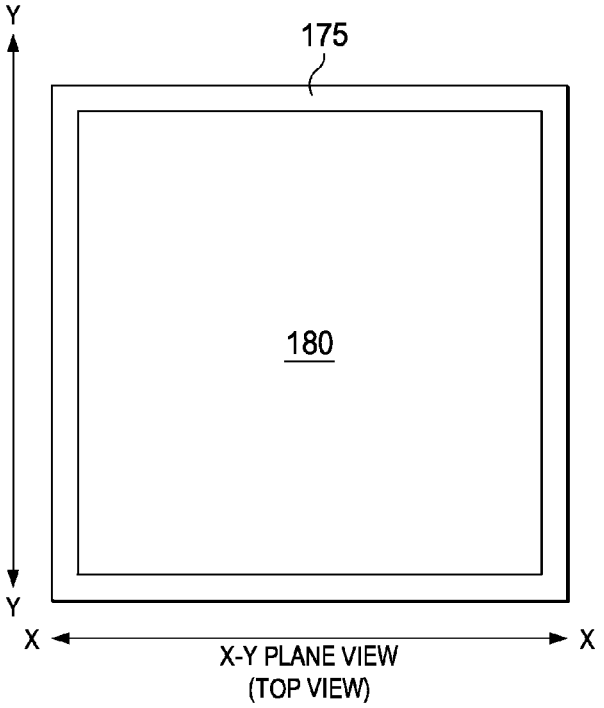

Referring to FIGS. 5A, 5B, and 5C, gate dielectric layer 175 and gate electrode layer 180 are formed. The respective step is shown as step 14 in FIG. 1. As shown in FIG. 5A, gate dielectric layer 175 and gate electrode layer 180 are deposited on the sidewalls and top surfaces of semiconductor fins 155. The formation methods for both gate dielectric layer 175 and gate electrode layer 180 may include CVD, ALD, PVD, or other applicable deposition methods. Gate dielectric layer 175 may include a TiN capping layer (not shown), which is formed on the sidewalls of fins 155. Other dielectric material such as silicon oxide, silicon nitride, high-k dielectric materials, or the like, may also be used to form gate dielectric layer 175. As shown in FIGS. 5B and 5C, gate dielectric layer 175 and gate electrode layer 180 are formed as blanket layers covering the entire structures. In FIG. 5C, gate dielectric layer 175 and gate electrode layer 180 are illustrated as slightly offset from each other, although gate electrode layer 180 covers the entirety of gate dielectric layer 175.

Figure 6A:
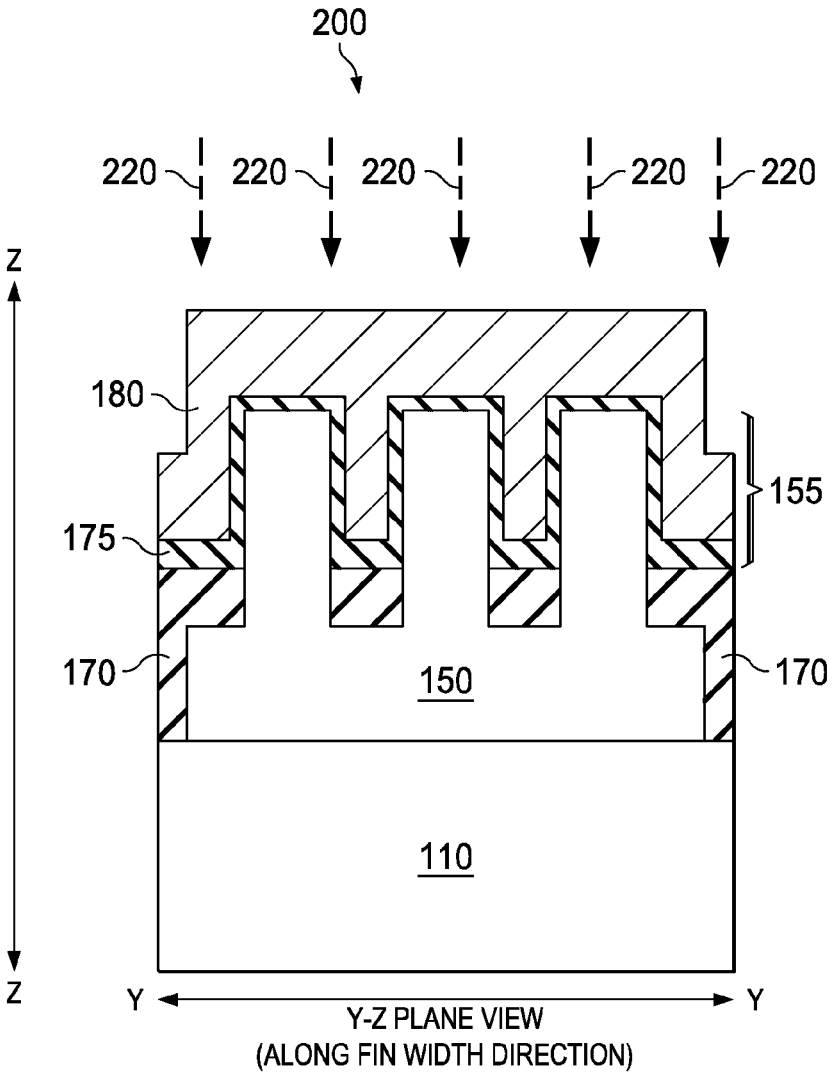
Figure 6B:
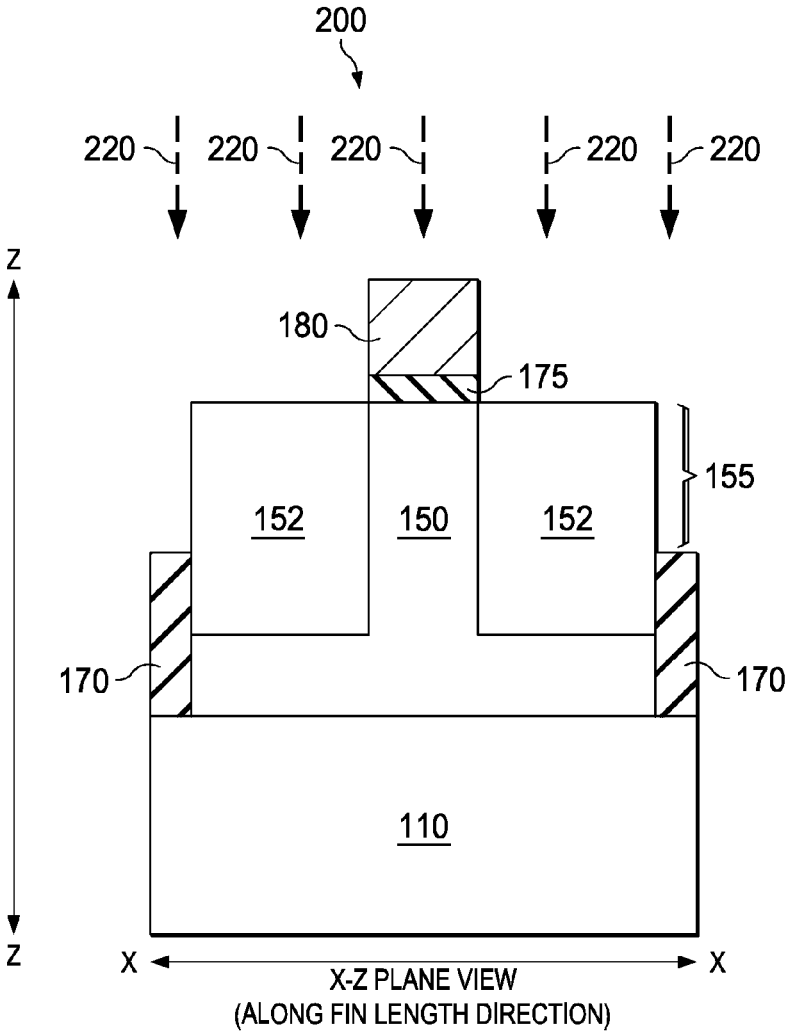
Figure 6C:
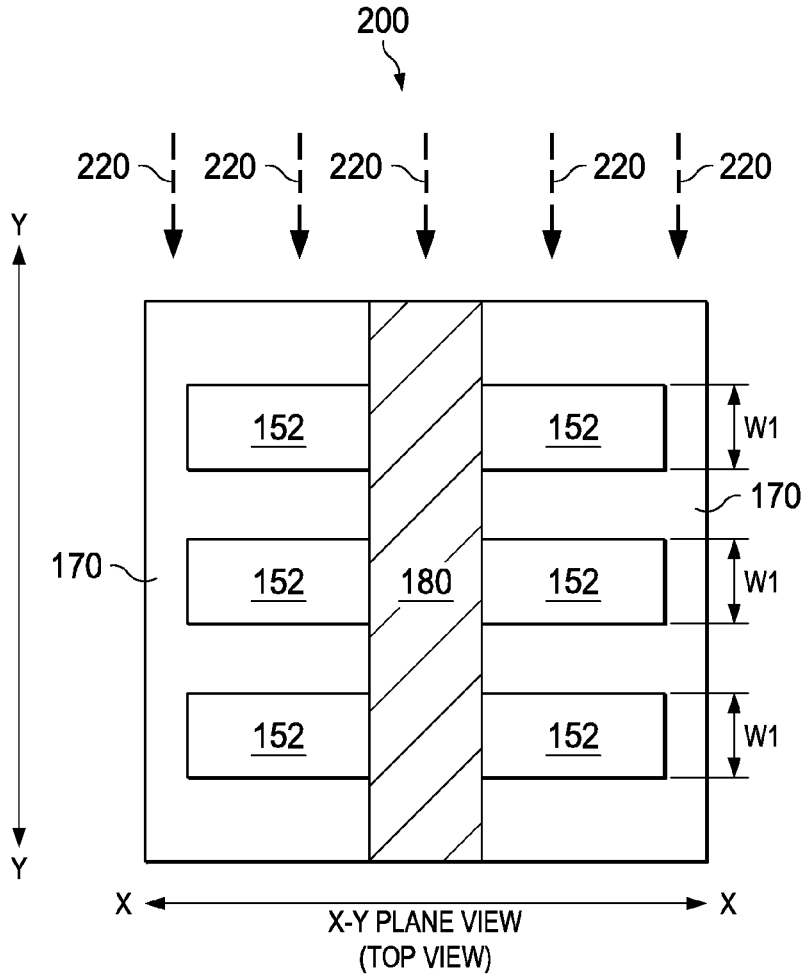

Referring to FIGS. 6A, 6B, and 6C, gate dielectric layer 175 and gate electrode layer 180 are patterned to form a gate structure including gate dielectric 175 and gate electrode 180, respectively. The respective step is shown as step 15 in FIG. 1. As shown in FIG. 6C, which is a top view, gate dielectric 175 and gate electrode 180 covers the middle portions of fins 155, wherein the opposite end portions are not covered. Next, an implantation 220 may be performed to form source and drain regions 152 in the exposed portions of fin structures 150. In alternative embodiments, implantation step 220 is skipped. Throughout the description, the term "source/drain" is used to refer to a source region or a drain region. In some embodiments, source and drain regions 152 are of p-type (when the resulting FinFET is a p-type FinFET) or n-type (when the resulting FinFET is an n-type FinFET). The impurity concentration in source and drain regions 152 may be between about $1\times10^{18}/cm^3$ and about $3\times10^{21}/cm^3$.

Figure 7A:
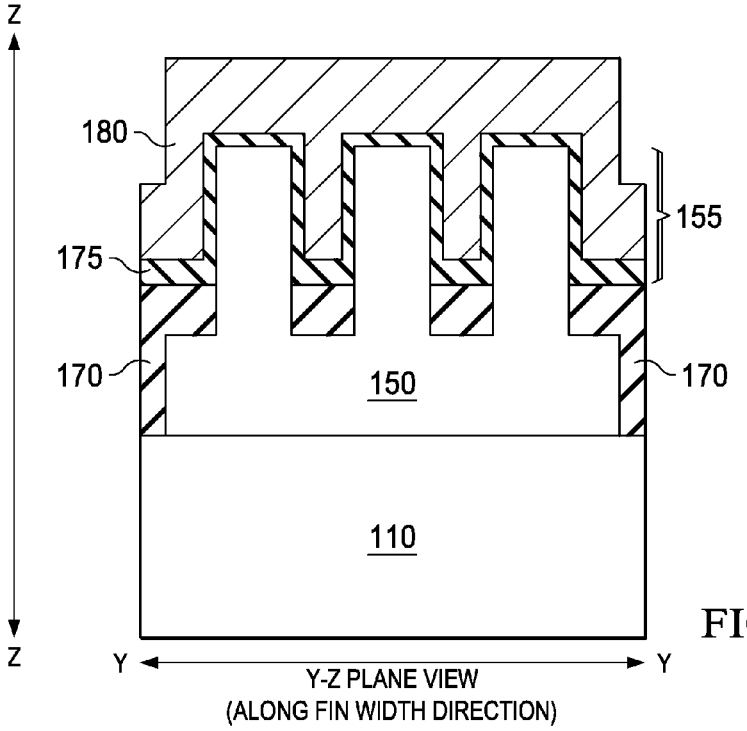
Figure 7B:
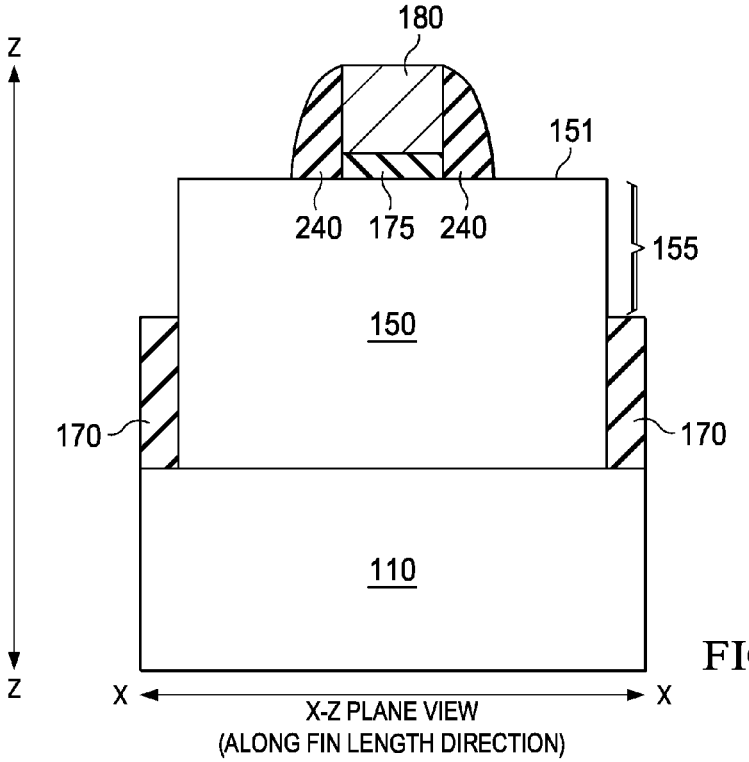
Figure 7C:
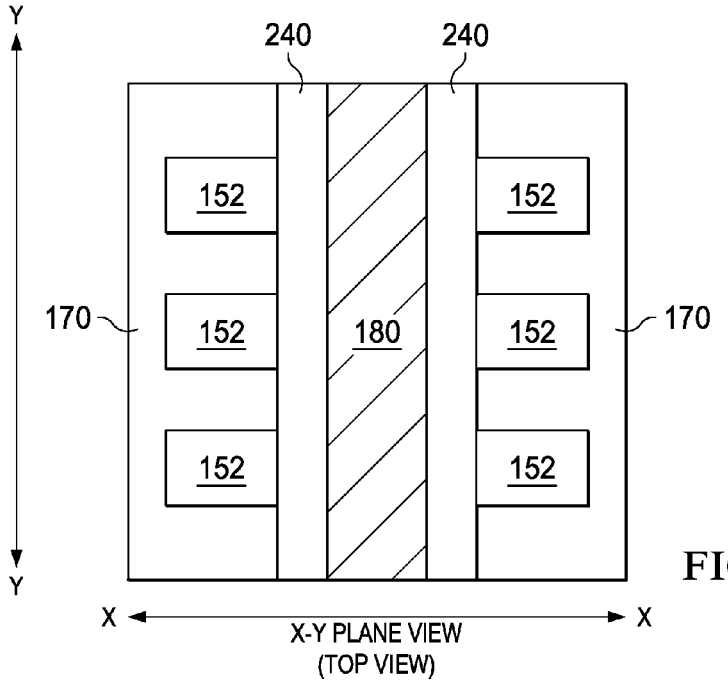

FIGS. 7A, 7B, and 7C illustrate the formation of gate spacers 240 on the sidewalls of gate dielectric 175 and gate electrode 180. The respective step is shown as step 16 in FIG. 1. In some embodiments, gate spacers 240 include a silicon oxide layer on a silicon nitride layer, although other dielectric materials may be used.

Figure 7D:
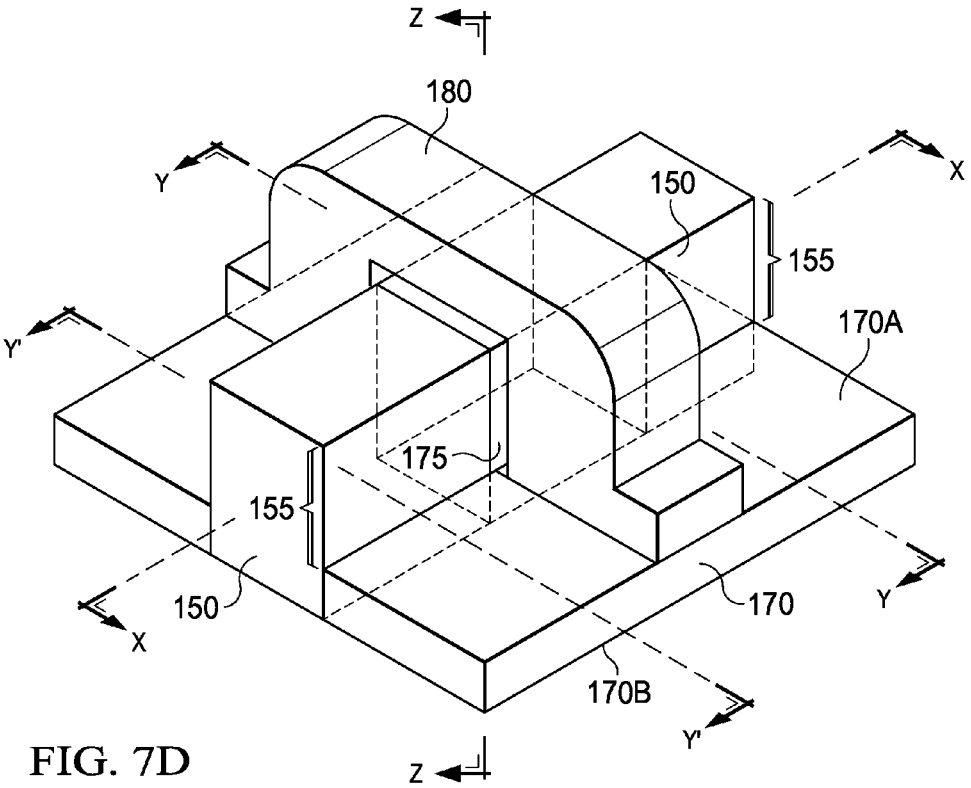

FIG. 7D illustrate a perspective view of the structure in FIGS. 6A-6C. For clarity, one of fin structures 150 is illustrated, although a plurality of fin structure 150 may exist, as in FIG. 7A. Furthermore, gate spacers 240 are not shown in FIG. 7D, although gate spacers 240 have been formed in this step. It is shown that gate dielectric 175 and gate electrode 180 are formed on the middle portions of fin 155. Furthermore, gate dielectric 175 and gate electrode 180 extend on, and cover, some portions of STI regions 170. Some other portions of STI regions 170, however, are not covered by gate dielectric 175, gate electrode 180, and gate spacers 240, and are exposed.

Figure 8A:
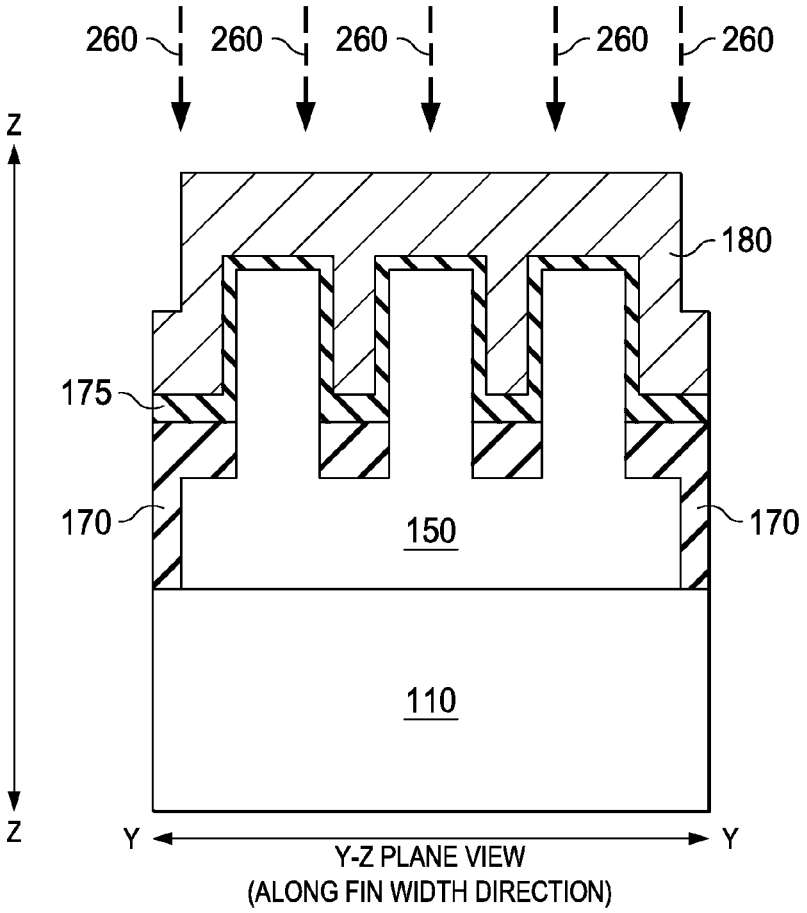

FIGS. 8A through 9C and 9C' are steps for enlarging source and drain regions. In FIGS. 8A, 8B, and 8C, fin structures 150 are recessed (FIGS. 8B and 8C) in etching step 260, which may be a dry etching, for example. The respective step is shown as step 17 in FIG. 1. As the result of the recessing step, as shown in FIG. 8B, recesses 270 are formed (compare to FIG. 7B) by etching fin structures 150 to the level marked as 280, wherein level 280 may be lower than (or level with or higher than) the top surface of STI regions 170. In addition, as shown in FIG. 8C, after the recessing of fin structures 150, the exposed portions of STI regions 170 in FIG. 7C (also compare to FIGS. 7C and 7D) are also etched through, so that the underlying semiconductor portions 151 (refer to the marking in FIG. 3A) are exposed. As shown in FIG. 8C, in the top view, the exposed portions of the semiconductor materials including portions 150 and 151 that form continuous semiconductor regions. The top surfaces of portions 150 and 151 may also be substantially flat. One of the continuous semiconductor regions is on the source side, and the other is on the drain side. Fin structures 150 and fin-bottom-regions 151 are illustrated using dashed lines since they may not be clearly distinguished from each other.

In some other embodiments, the recessing step for forming recesses 270 (FIGS. 8A-8C) are not preformed. Furthermore, STI regions 170 are not etched. The skipping of this step corresponds to FinFET 440 in FIGS. 15A and 15B.

Figure 8B:
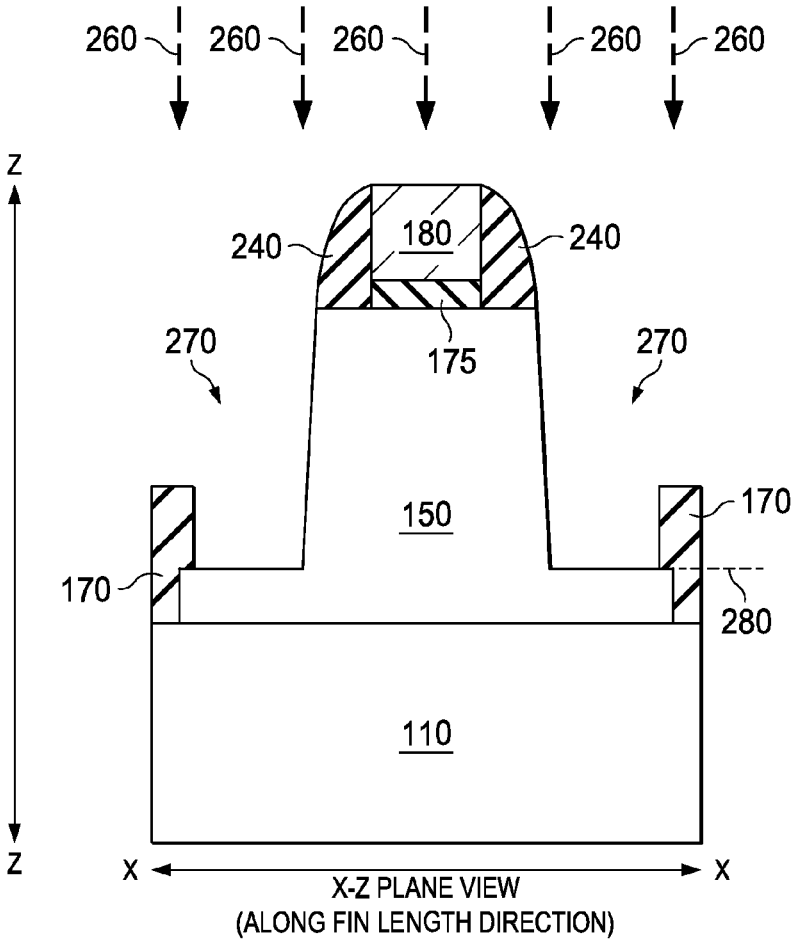
Figure 8C:
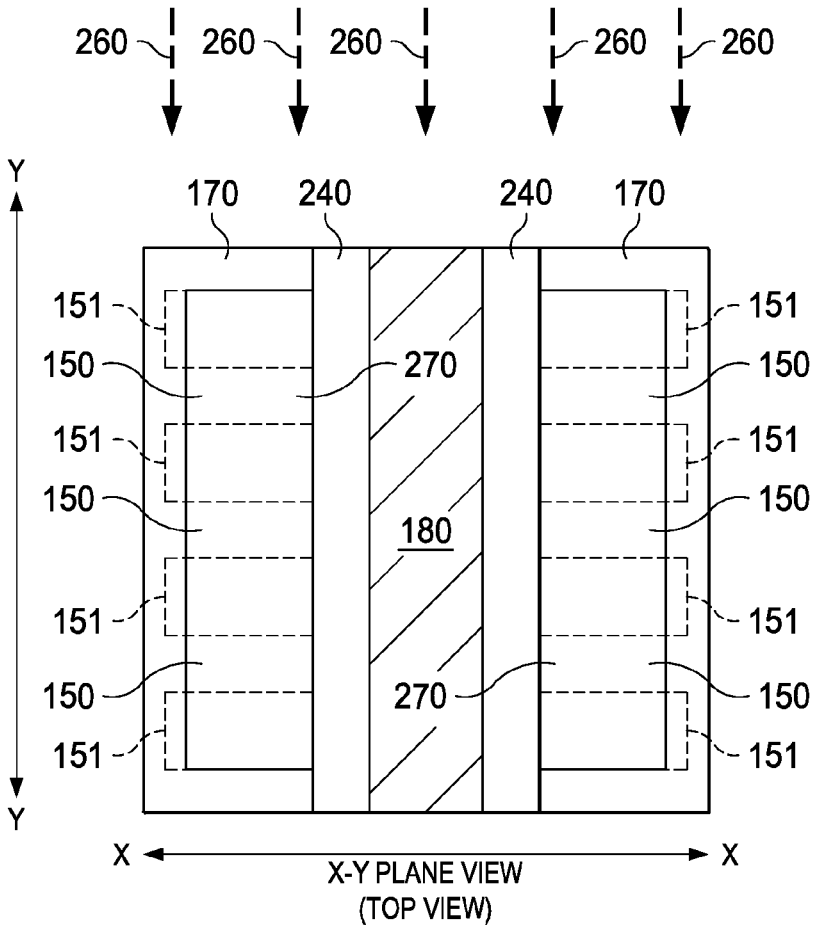
Figure 9A:
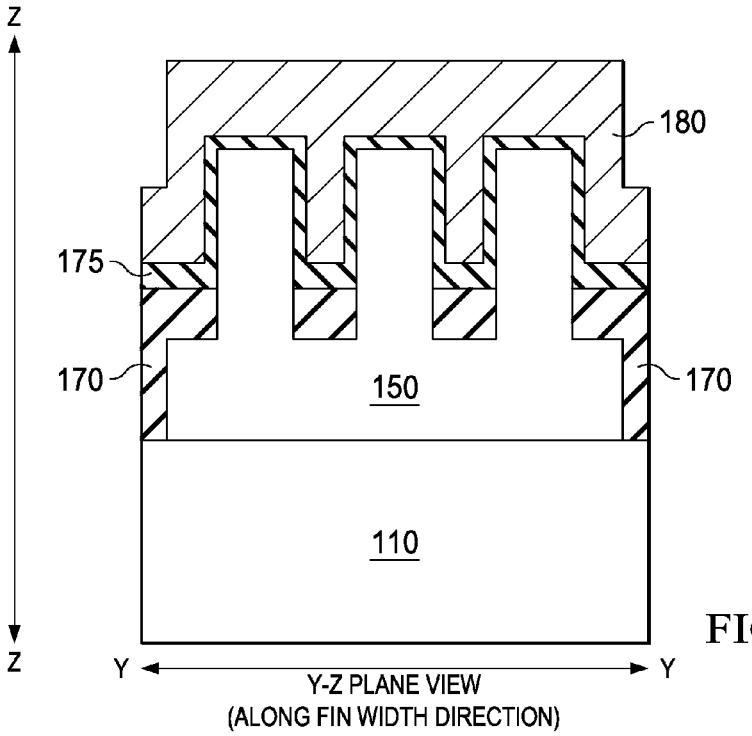
Figure 9B:
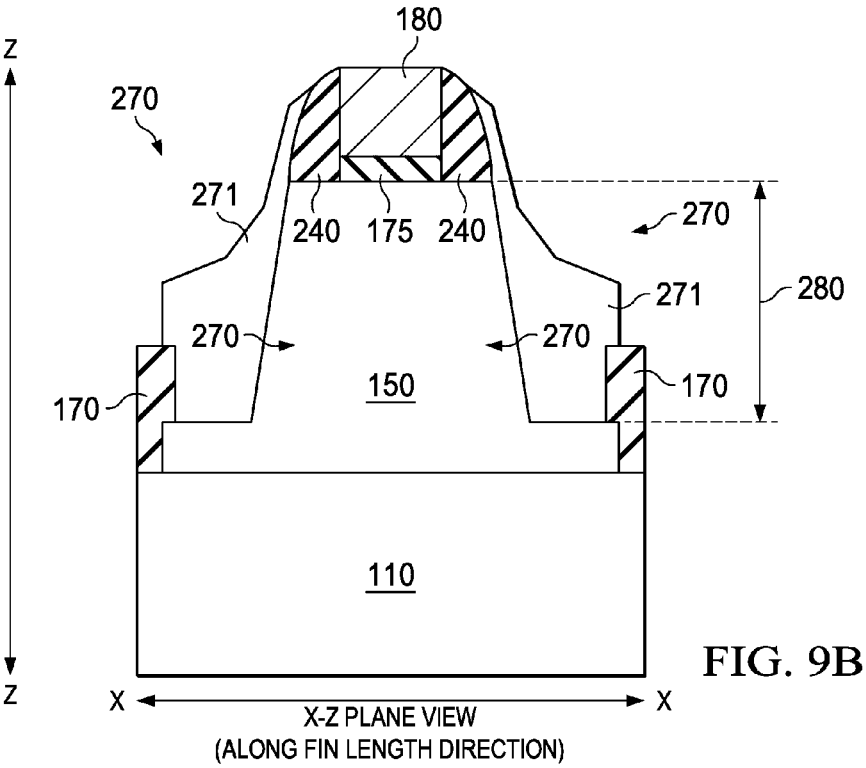
Figure 9C:
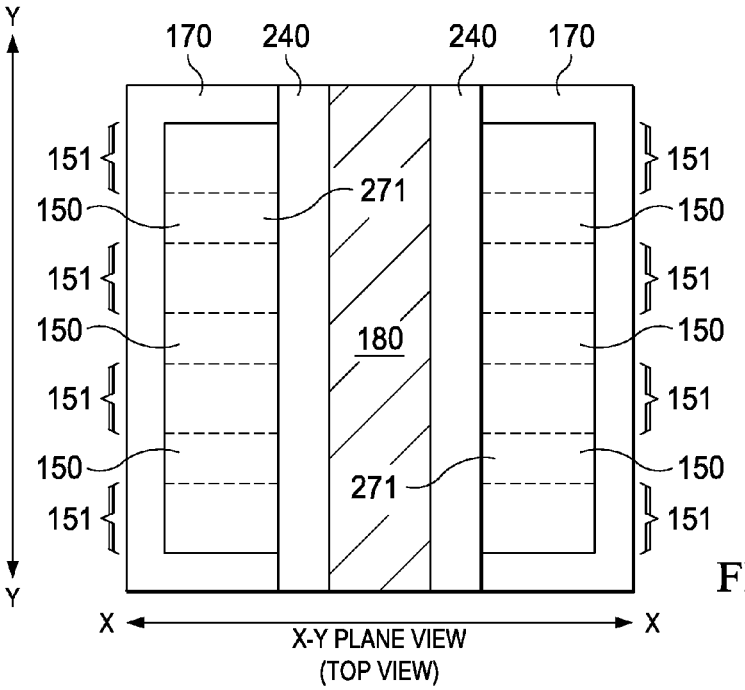
Figure 9C:
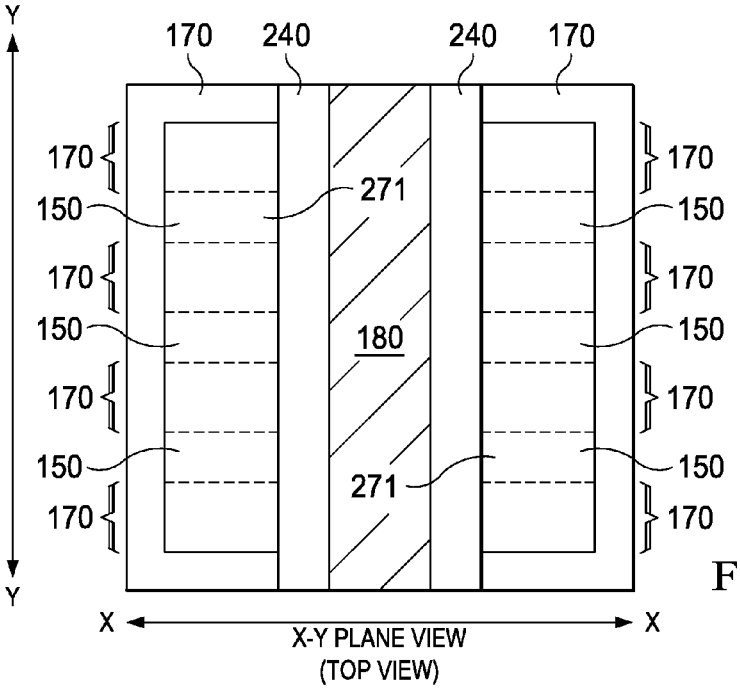

Referring to FIGS. 9A, 9B, and 9C, semiconductor capping layer 271 is formed over the top surface of the exposed semiconductor materials in FIGS. 8A-8C. The respective step is shown as step 18 in FIG. 1. Semiconductor capping layer 271 may be formed of a semiconductor material similar to (which may be identical to) the semiconductor material of substrate 110. For example, when substrate 110 is a silicon substrate, semiconductor capping layer 271 may be formed of silicon. Alternatively, semiconductor capping layer 271 is formed of a semiconductor material (such as silicon germanium or silicon carbon) similar to, but different from, that of substrate 110. For example, semiconductor capping layer 271 and substrate 110 may have a lattice mismatch smaller than about 6 percent. As shown in FIG. 9C, semiconductor capping layer 271 may be interconnected as continuous semiconductor regions. Fin structures 150 and fin-bottom-regions 151 are illustrated using dashed lines since they are under semiconductor capping layer 271.

When the step shown in FIG. 8A-8C is skipped, semiconductor capping layer 271 is grown from the sidewalls and the top surfaces of fin structures 150 in FIG. 7. FIG. 9C' illustrates the top view of the respective structure. Fin structures 150 and STI regions 170 are illustrated using dashed lines since they are under semiconductor capping layer 271. FIG. 15A illustrates a perspective view of a portion of the structure, which includes one fin structure 150 and the overlying semiconductor capping layer 271. As shown in FIG. 9C, in some embodiments, fin structures 150 are close to each other, and hence portions of semiconductor capping layer 271 grown from different fin structures 150 merge with each other to form the continuous semiconductor capping layer 271. In these embodiments, however, there are portions of STI regions 170 underlying semiconductor capping layer 271, as illustrated by dashed lines.

Figure 10A:
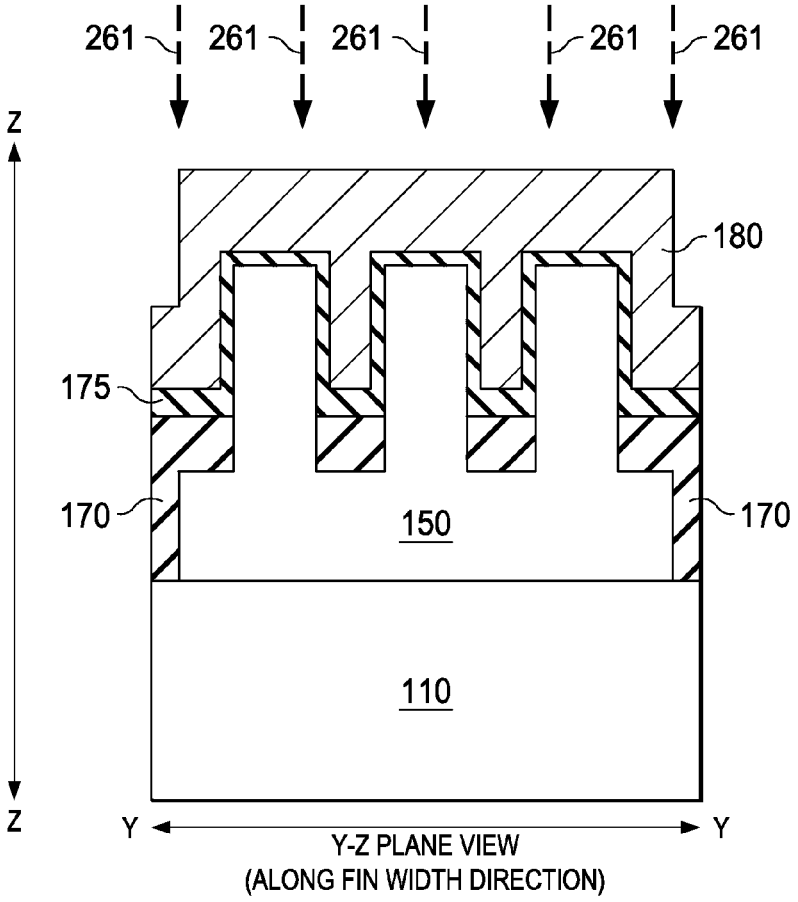
Figure 10B:
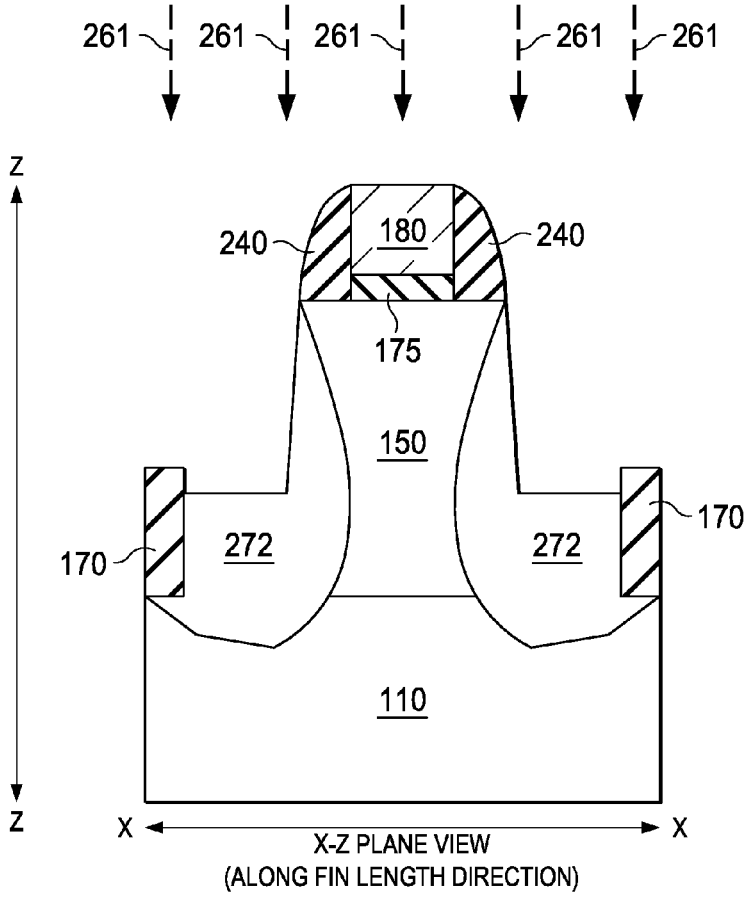
Figure 10C:
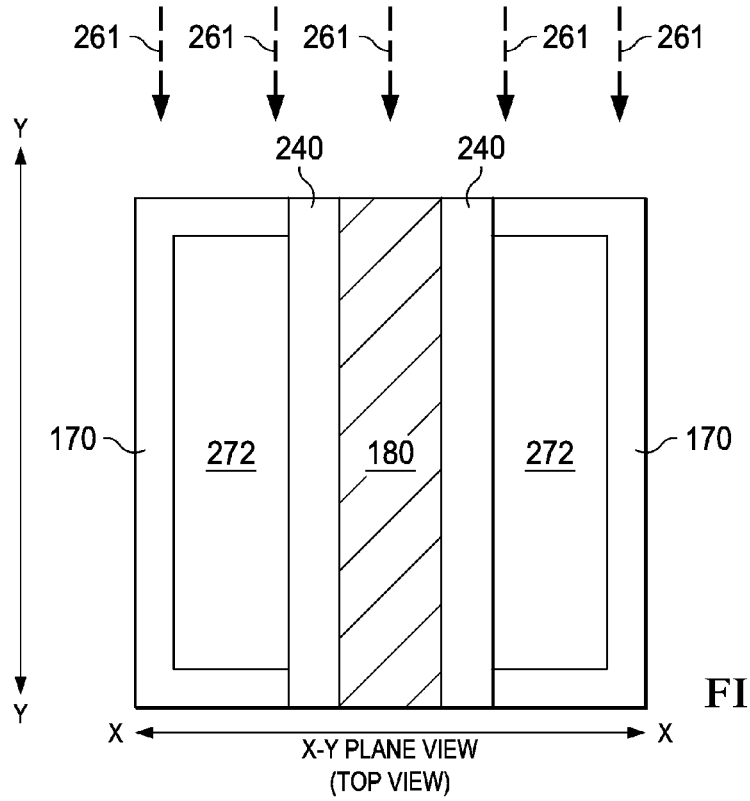

Referring to FIGS. 10A, 10B, and 10C, Pre-Amorphization Implantation (PAI, also sometimes referred to as pre-amorphous implantation) 261 is performed on the structure shown in FIGS. 8A-8C. The respective step is shown as step 19 in FIG. 1. In alternative embodiments, PAI 261 may be performed on the structures shown in FIGS. 9C', and the respective resulting structure may be realized by one of skill in the art with the teaching of the embodiments. In some embodiments, the PAI is performed using germanium, silicon, or the like. The dosage may be between about $5\times10^{14}/cm^2$ and about $3\times10^{15}/cm^2$. The temperature of the respective wafer in the PAI may be between about −100° C. and about −40° C. during the PAI. With a low implantation temperature, the damage caused by the PAI to the illustrated structure may be reduced. In alternative embodiments, the implantation is performed at room temperatures.

As a result of PAI 261, as shown in FIG. 10B, amorphized regions 272 are formed. Amorphized regions 272 may include semiconductor capping layer 271 (FIGS. 9B and 9C), fin structures 150, and some top portions of substrate 110. The implanted portions of semiconductor capping layer 271 and substrate 110 become amorphized regions 272, which include amorphous silicon, and possibly some polysilicon grains. As shown in FIG. 10A, the portions of fin structures 150 underlying gate electrodes 180 are protected from the PAI, and remain to have a crystalline structure.

Figure 11A:
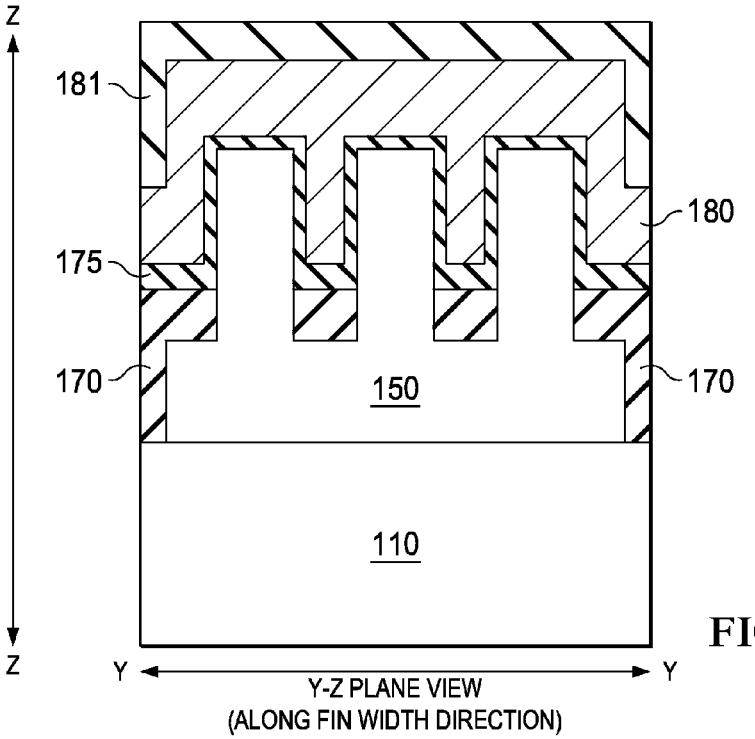
Figure 11B:
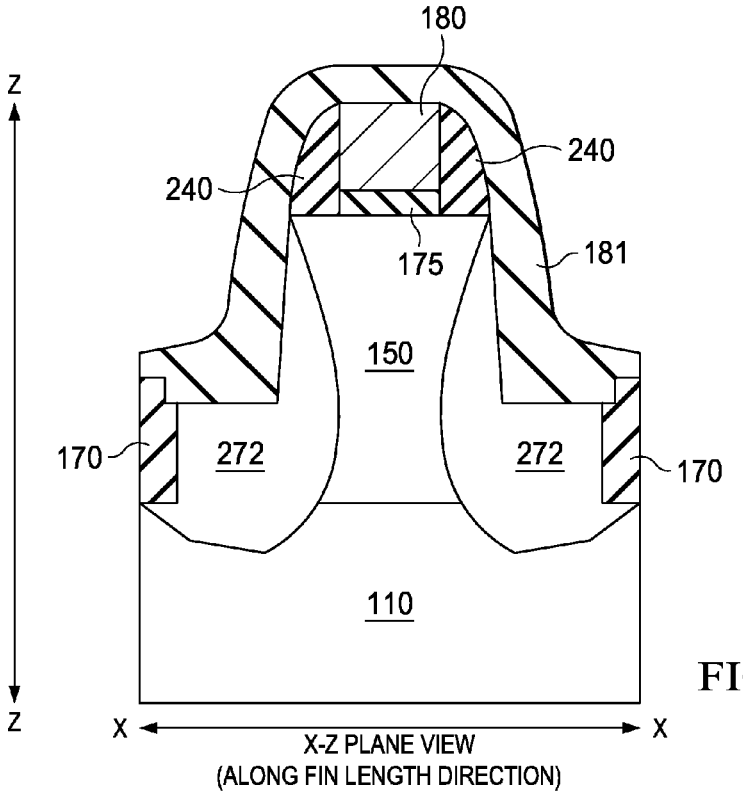
Figure 11C:
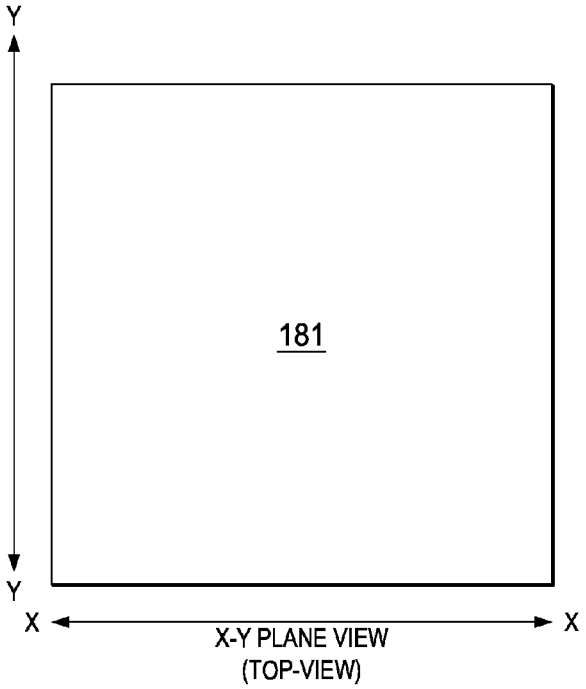

Referring to FIGS. 11A, 11B, and 11C, strained capping layer 181 is performed on the structure shown in FIGS. 10A-10C. The respective step is a part of step 20 in FIG. 1. The materials of strained capping layer 181 may include silicon nitride, titanium nitride, oxynitride, oxide, SiGe, SiC, SiON, and/or combinations thereof. Strained capping layer 181 may have an inherent tensile stress or compressive stress. For example, when the resulting FinFET is a p-type FinFET, strained capping layer 181 may have an inherent compressive stress. Conversely, when the resulting FinFET is an n-type FinFET, strained capping layer 181 may have an inherent tensile stress. The formation process of strained capping layer 181 is adjusted to tune the stress to a desirable value. In some embodiments, strained capping layer 181 includes a single layer. In other embodiments, strained capping layer 181 includes a plurality of sub layers. The formation methods may include ALD, CVD, PVD, or the like.

Referring to FIGS. 12A, 12B, and 12C, an annealing is performed to form dislocation planes 157 in amorphized regions 272 (FIG. 11B). The respective step is also a part of step 20 in FIG. 1. The annealing may be performed using Rapid Thermal Anneal (RTA), laser anneal, or other anneal methods. In some embodiment, the annealing is performed using spike RTA, with the annealing temperature between about 900° C. and about 1100° C., for example. As a result of the annealing, amorphized regions 272 as in FIG. 11B are recrystallized with a memorized stress obtained from strained capping layer 181.

As the result of the annealing, dislocation planes 157 (FIG. 12B) are also formed. Although illustrated as lines in the cross-sectional view shown in FIG. 12B, dislocation planes 157 are planes that extend in the longitudinal direction of gate electrode 180, which is also the Y direction in FIGS. 14A and 15A.

Next, an etch step is performed, and strained capping layer 181 is removed. In the embodiments in which the step in FIGS. 8A-8C is skipped, the resulting structure is shown in FIGS. 15A and 15B. Otherwise, the resulting structure is shown in FIGS. 13A-13C, 14A, and 14B.

As also shown in FIGS. 13A, 13B, and 13C, a first epitaxy is performed to form un-doped epitaxy semiconductor layers 290 on fin structures 150. Un-doped epitaxy semiconductor layers 290 are free from p-type and n-type impurities. In some embodiments, un-doped epitaxy semiconductor layers 290 may comprise silicon germanium or silicon carbon when the respective FinFET 440 is a p-type FinFET or an n-type FinFET, respectively. Un-doped epitaxy semiconductor layers 290 is used to reduce leakage currents between the subsequently formed stressors 300 and fin structures 150, wherein stressors 300 form the source and drain regions of FinFET 440.

A second epitaxy is performed to form stressors 300 on un-doped epitaxy semiconductor layers 290. Similarly, stressors 300 may comprise silicon germanium or silicon carbon when the respective FinFET 440 is a p-type FinFET or an n-type FinFET, respectively. Accordingly, stressors 300 may apply a compressive stress or a tensile stress to the channel region of FinFET 440. Stressors 300 may be doped heavily with a p-type or an n-type impurity, wherein the doping concentration may be between about $5\times10^{19}/cm^3$ and about $3\times10^{21}/cm^3$. During the first and the second epitaxy steps, dislocation planes 157 grow into un-doped epitaxy semiconductor layers 290 and stressors 300, respectively.

FIGS. 14A and 15A illustrate perspective views of FinFET 440 in accordance with various embodiments. FIG. 14A illustrates the perspective view of the structure in FIGS. 13A-13C, wherein some of the components in FinFET 440 are not denoted in detail. As shown in FIG. 14A, dislocation planes 157 are formed in regions 150, 290, and 300, and may extend to a level lower than the bottom surfaces of STI regions 170. Dislocation planes 157 further extend into regions 290 and 300 (FIG. 13B). Dislocation planes 157 have bottoms 158, which may be lower than top surfaces 170A of STI region 170, and lower than bottom surfaces 170B of STI regions 170. Dislocation planes 157 may also comprise portions overlapped by gate spacers 240, as shown in FIG. 13B.

Figure 14B:
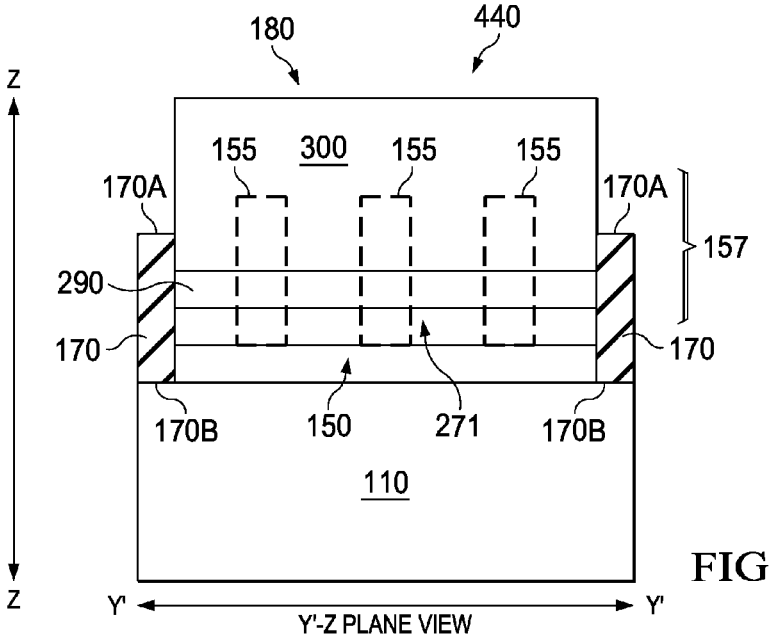
Figure 15A:
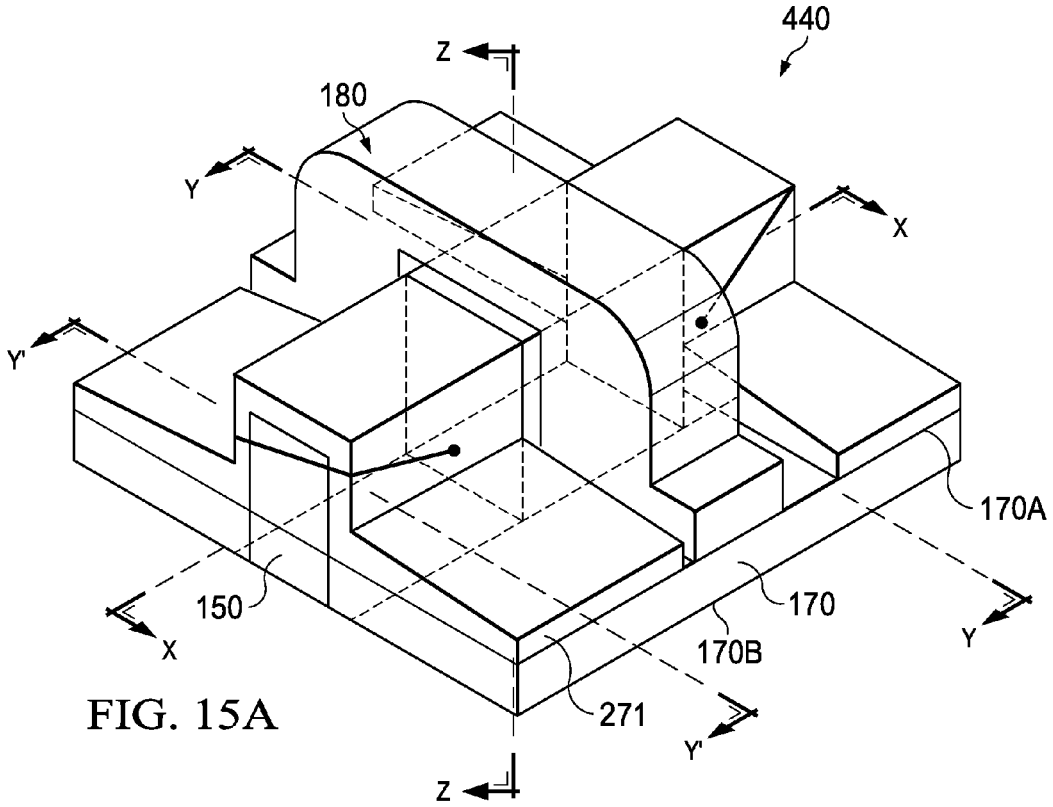
FIGS. 15A and 15B illustrate a perspective view and a cross-sectional view, respectively, of a FinFET in accordance with some alternative exemplary embodiments, wherein source and drain regions comprise end portions of semiconductor fins and semiconductor capping layers formed thereon.
Figure 15B:
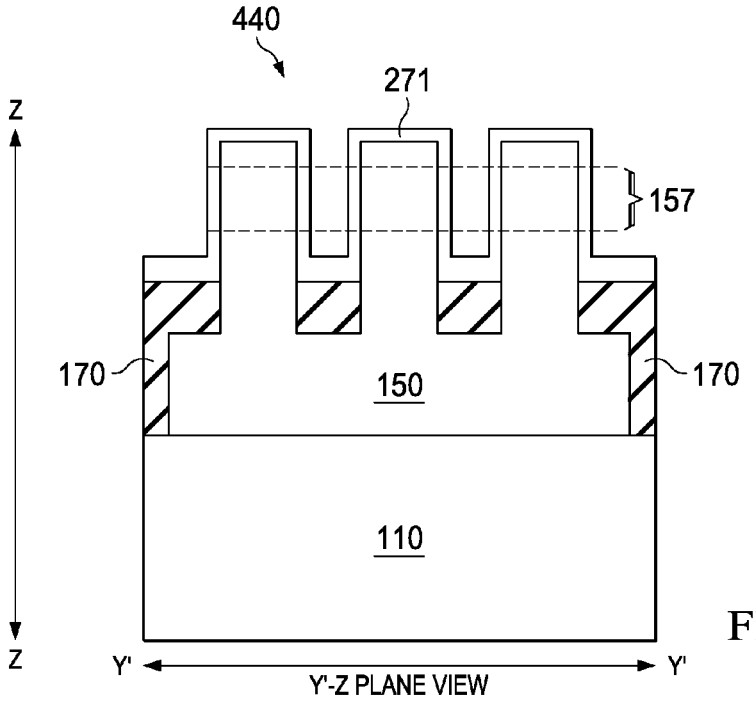

FIG. 14B illustrates a cross-sectional view of FinFET 440, wherein the cross-sectional view is obtained from the plane crossing lines Y'-Y' and Z-Z, which plane is referred to as Y'-Z plane. This plane crosses the source region or the drain region of FinFET 440, rather than crosses the gate of FinFET 440. The range of dislocation planes 157 is marked. Furthermore, fins 155 are marked. Since fins 155 are in the Y-Z plane, and are not in the Y'-Z plane, fins 155 are shown using dashed lines.

In the embodiments shown in FIGS. 14A and 14B, dislocation planes 157 are formed to improve the mobility of the carriers in FinFET 440. Process may be adjusted to make the bottoms 158 of dislocation planes 157 to be below the top surface 170A of STI regions 170 (FIGS. 13B and 14A), so that the improvement in carrier mobility can be maximized. Furthermore, depth D1 (FIG. 13B) of dislocation planes 157, which depth D1 is measured from the top surface of fin structures 150 to the bottoms 158 of dislocation planes 157, may be between about 25 nm and about 55 nm. Proximity S1 (FIG. 13B), which is the horizontal distance between the edge of gate electrode 180 and the bottoms 158 of dislocation planes 157, may be between about −4 nm and about +12 nm, for example. Experiments have shown that with such depth D1 and proximity S1, some exemplary FinFETs 440 may have maximized stresses in their channel regions.

FIG. 15A illustrates the perspective view of the structure formed with step in FIGS. 8A-8C and 13A-13C skipped, wherein some of the components in FinFET 440 are not denoted in detail. In these embodiments, the original fin structures 150 are not recessed, and semiconductor capping layer 271 are formed on the sidewalls and the top surfaces of the opposite exposed end portions (FIG. 7D) of fin structures 150. Layers 290 and 300 may not be formed in these embodiments, although they can also be formed. As shown in FIG. 15B, dislocation planes 157 are formed in fin structures 150 and semiconductor capping layer 271. Dislocation planes 157 may be higher than the top surfaces of STI regions 170. Experiments revealed that with such a position of the dislocation planes 157, the stresses in the channel regions of some exemplary FinFETs 440 can be maximized. Again, the thickness of STI regions 170 in FIGS. 14A and 15A may be smaller than about 20 nm in exemplary embodiments.

The embodiments of the present disclosure may be applied to various types of FinFETs, including, and not limited to, depletion mode FinFETs, accumulation mode FinFETs, and the like. One of ordinary skill in the art will realize the respective structures.

In accordance with embodiments, a device includes a semiconductor fin over a substrate, a gate dielectric on sidewalls of the semiconductor fin, and a gate electrode over the gate dielectric. A source/drain region is on a side of the gate electrode. A dislocation plane is in the source/drain region.

In accordance with other embodiments, a device includes a semiconductor fin over a substrate, a gate dielectric on sidewalls of the semiconductor fin, a gate electrode over the gate dielectric, and an STI region having a portion overlapped by a portion of the gate electrode and adjoining the semiconductor fin. A source region and a drain region are disposed on opposite sides of the gate electrode, wherein the STI region is located substantially between the source region and the drain region. A first dislocation plane extends into the source region. A second dislocation plane extends into the drain region.

In accordance with yet other embodiments, a method includes forming a gate dielectric on sidewalls of a middle portion of a semiconductor fin, forming a gate electrode over the gate dielectric, forming a source/drain region on a side of the gate electrode, and forming a strained capping layer. The strained capping layer includes a portion overlapping the gate electrode. After the step of forming the strained capping layer, an annealing is performed to form a dislocation plane in a semiconductor material underlying the strained capping layer. After the annealing, the strained capping layer is removed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:

a first semiconductor fin over a substrate;

a first gate dielectric on sidewalls of the first semiconductor fin;

a first gate electrode over the first gate dielectric;

a first source/drain region on a side of the first gate electrode[;], *the first source/drain region comprising:*

*a semiconductor capping layer directly contacting the first semiconductor fin, the semiconductor capping layer comprising a first material, wherein the first material is different from a material of the substrate;*

*a first semiconductor region over the semiconductor capping layer, wherein the first semiconductor region comprises a second material different from the first material; and*

*a second semiconductor region over a top and side of the first semiconductor region, the second semiconductor region comprising a third material different from the first material, wherein the second semiconductor region has a higher concentration of dopants than the semiconductor capping layer and the first semiconductor region;* a first dislocation plane in the first source/drain region; and a Shallow Trench Isolation (STI) region comprising a first portion overlapped by a portion of the first gate electrode, wherein the first dislocation plane comprises a first portion higher than a top surface of the STI region, and a second portion lower than the top surface of the STI region.

2. The device of claim 1, wherein the first dislocation plane has a bottom higher than a bottom surface of the STI region.

3. The device of claim 1 further comprising:

a second semiconductor fin over the substrate and parallel to the first semiconductor fin;

a second gate dielectric on sidewalls of the second semiconductor fin;

a second gate electrode over the second gate dielectric, wherein the first and the second gate electrodes are interconnected to form a continuous gate electrode;

a second source/drain region on a side of the second gate electrode, wherein the first and the second source/drain regions are interconnected to form a continuous source/drain region; and a second dislocation plane in the second source/drain region.

4. The device of claim 3, wherein the STI region is free from substantial portions overlapped by the continuous source/drain region.

5. The device of claim 1, wherein outer portions of the first dislocation plane farther away from the first gate electrode are higher than inner portions of the first dislocation plane closer to the first gate electrode.

6. The device of claim 1, wherein the first [source/drain region comprises a first portion comprising] *semiconductor*

*region and the second semiconductor region comprise* silicon and an element selected from germanium and carbon, [and a second portion comprising silicon and free from the element,] wherein the first dislocation plane extends into the first source/drain region.

7. A device comprising:

a semiconductor fin over a substrate;

a gate dielectric on sidewalls of the semiconductor fin;

a gate electrode over the gate dielectric;

a Shallow Trench Isolation (STI) region comprising a portion overlapped by a portion of the gate electrode and adjoining the semiconductor fin;

a source region and a drain region on opposite sides of the gate electrode, wherein the STI region is located substantially between the source region and the drain region, *wherein the semiconductor fin extends into the source region and the drain region, the source region and the drain region each comprising:*

*a first portion of the semiconductor fin; and*

*a semiconductor capping layer on a top surface and sidewalls of the first portion of the semiconductor fin*;

a first dislocation plane extending into the source region; and a second dislocation plane extending into the drain region, wherein at least a *first* portion of each of the first dislocation plane and the second dislocation plane is over a top surface of the STI region, *wherein a second portion of each of the first dislocation plane and the second dislocation plane overlap the STI region.*

8. The device of claim 7, wherein bottoms of the first and the second dislocation planes are higher than a bottom surface of the STI region.

9. The device of claim 7 further comprising:

an additional semiconductor fin over the substrate and adjacent to the semiconductor fin, wherein the semiconductor fin and the additional semiconductor fin are on opposite sides of an entirety of the STI region, and wherein the gate electrode extends over the additional semiconductor fin.

10. The device of claim 9, wherein the source region and the drain region extend to opposite sides of the additional semiconductor fin.

11. The device of claim 7, wherein outer portions of the first dislocation plane farther away from the gate electrode are higher than inner portions of the first dislocation plane closer to the gate electrode.

12. The device of claim 7, wherein the source region and the drain region comprise a semiconductor material having a lattice constant different from a lattice constant of the semiconductor fin.

13. The device of claim 7, wherein the source region comprises a first portion comprising silicon and an element selected from germanium and carbon, and a second portion comprising silicon and free from the element.

14. A device comprising:

a first semiconductor fin over a substrate;

a first gate dielectric on sidewalls of the first semiconductor fin;

a first gate electrode over the first gate dielectric;

*a Shallow Trench Isolation (STI) region at least partially overlapped by the first gate electrode;* a first source/drain region on a side of the first gate electrode[;], *wherein the first semiconductor fin extends into the first source/drain region, the first source/drain region comprising:*

*a first portion of the first semiconductor fin, wherein the first portion of the first semiconductor fin extends above a top surface of the STI region; and*

*a semiconductor capping layer on a top surface and sidewalls of the first portion of the first semiconductor fin, wherein the semiconductor capping layer is made of a material different from a material of the substrate; and* a first dislocation plane in the first source/drain region[; and a Shallow Trench Isolation (STI) region comprising a portion overlapped by a portion of the first gate electrode, wherein an entirety of the first dislocation plane is higher than a top surface of the STI region], *wherein an entirety of the first dislocation plane is higher than a top surface of the STI region, wherein a portion of the first dislocation plane overlaps the STI region.*

15. The device of claim 14, wherein the first [semiconductor fin extends into the first source/drain region, wherein the first source/drain region further comprises a semiconductor capping layer on the sidewalls and a top surface of the first semiconductor fin, and wherein a portion of the first dislocation plane overlaps the STI region] *dislocation plane extends into the semiconductor capping layer and the first portion of the first semiconductor fin.*

16. The device of claim 14 further comprising:

a second semiconductor fin over the substrate and parallel to the first semiconductor fin;

a second gate dielectric on sidewalls of the second semiconductor fin;

a second gate electrode over the second gate dielectric, wherein the first and the second gate electrodes are interconnected to form a continuous gate electrode;

a second source/drain region on a side of the second gate electrode, wherein the first and the second source/drain regions are interconnected to form a continuous source/drain region; and a second dislocation plane in the second source/drain region.

17. The device of claim 16, wherein the STI region is free from substantial portions overlapped by the continuous source/drain region.

18. The device of claim 14, wherein outer portions of the first dislocation plane farther away from the first gate electrode are higher than inner portions of the first dislocation plane closer to the first gate electrode.

19. The device of claim 14, wherein the first source/drain region comprises a first portion comprising silicon and an element selected from germanium and carbon, and a second portion comprising silicon and free from the element.

*20. A device comprising:*

*a first semiconductor fin over a substrate;*

*a first gate dielectric on sidewalls of the first semiconductor fin;*

*a first gate electrode over the first gate dielectric;*

*a first source/drain region on a side of the first gate electrode, the first source/drain region comprising:*

*a semiconductor capping layer directly contacting the first semiconductor fin, the semiconductor capping layer comprising a first material, wherein the first material is different from a material of the substrate;*

*a first semiconductor region over the semiconductor capping layer, the first semiconductor region comprising a second material different from the first material; and*

*a second semiconductor region over a top and side of the first semiconductor region, the second semicon-*

*ductor region comprising a third material different from the first material, wherein the second semiconductor region has a higher concentration of dopants than the first semiconductor region and the semiconductor capping layer;*

*a first dislocation plane in the first source/drain region; and*

*a Shallow Trench Isolation (STI) region adjacent the first semiconductor fin, wherein the first dislocation plane comprises a first portion higher than a top surface of the STI region, and a second portion lower than the top surface of the STI region.*

*21. The device of claim 20, wherein the first dislocation plane has a bottom higher than a bottom surface of the STI region.*

*22. The device of claim 20 further comprising:*

*a second semiconductor fin over the substrate and parallel to the first semiconductor fin;*

*a second gate dielectric on sidewalls of the second semiconductor fin;*

*a second gate electrode over the second gate dielectric, wherein the first and the second gate electrodes are interconnected to form a continuous gate electrode;*

*a second source/drain region on a side of the second gate electrode, wherein the first and the second source/drain regions are interconnected to form a continuous source/drain region; and*

*a second dislocation plane in the second source/drain region.*

*23. The device of claim 22, wherein the STI region is free from substantial portions overlapped by the continuous source/drain region.*

*24. A device comprising:*

*a substrate having a fin structure, the fin structure having a base portion and a plurality of upper portions extending from the base portion;*

*a Shallow Trench Isolation (STI) region extending along sidewalls of the base portion and over the base portion between adjacent ones of the plurality of upper portions;*

*a gate structure extending over the plurality of upper portions; and*

*a first source/drain region and a second source/drain region on opposing sides of the gate structure, the first source/drain region having a first dislocation plane, the first dislocation plane extending above an upper surface of the STI region, the first source/drain region comprising:*

*a first semiconductor layer made of a first material, wherein the first material is different from a material of the substrate, wherein the first semiconductor layer is in direct contact with one of the plurality of upper portions;*

*a second semiconductor layer over the first semiconductor layer, the second semiconductor layer comprising a second material different from the first material; and*

*a third semiconductor layer over a top and side of the second semiconductor layer, the third semiconductor layer comprising a third material different from the first material, wherein the third semiconductor layer has a higher concentration of dopants than the second semiconductor layer and the first semiconductor layer.*

*25. The device of claim 24, wherein the second source/drain region has a second dislocation plane.*

*26. The device of claim 25, wherein the second dislocation plane extends above an upper surface of the STI region.*

*27. The device of claim 25, wherein outer portions of the first dislocation plane is farther away from the gate structure are higher than inner portions of the first dislocation plane closer to the gate structure, and wherein outer portions of the second dislocation plane is farther away from the gate structure are higher than inner portions of the second dislocation plane closer to the gate structure.*

*28. The device of claim 24, further comprising a gate spacer adjacent the gate structure, wherein the first dislocation plane extends below the gate spacer.*

*29. The device of claim 28, wherein the first dislocation plane has a bottom higher than a bottom surface of the STI region.*

*30. The device of claim 24, wherein the first dislocation plane terminates between a first distance under the gate structure of 4 nm or less from an edge of the gate structure and a second distance of 12 nm or less laterally spaced apart from the edge of the gate structure.*

*31. The device of claim 24, wherein the STI region extends partially over an upper surface of the base portion of the fin structure.*

*32. The device of claim 24, wherein an entirety of the first dislocation plane is above the upper surface of the STI region.*

*33. The device of claim 24, wherein the first source/drain region and the second source/drain region comprise a different semiconductor material than the substrate.*

*34. The device of claim 33, wherein the first source/drain region extends directly over a portion of the STI region.*

*35. A device comprising:*

*a substrate having a fin structure, the fin structure having a mesa and a plurality of fins extending from the mesa;*

*a Shallow Trench Isolation (STI) region extending along sidewalls of the mesa and over the mesa between adjacent ones of the plurality of fins;*

*a gate structure extending over the plurality of fins; and*

*a first source/drain region and a second source/drain region on opposing sides of the gate structure, the first source/drain region having a first dislocation plane, the first dislocation plane extending into an underlying semiconductor material of the substrate, the first source/drain region comprising:*

*a first semiconductor layer made of a first material, wherein the first material is different from a material of the substrate, wherein the first semiconductor layer is in direct contact with one of the plurality of fins;*

*a first epitaxy region over the first semiconductor layer, the first epitaxy region comprising a second material different from the first material; and*

*a second epitaxy region, wherein the second epitaxy region is over a top and side of the first epitaxy region, wherein the second epitaxy region comprises a third material different from the first material, wherein the second epitaxy region has a higher concentration of dopants than the first semiconductor layer and the first epitaxy region.*

*36. The device of claim 35, wherein the plurality of fins do not extend into the first source/drain region and the second source/drain region.*

*37. The device of claim 35, wherein the first dislocation plane extends higher than an upper surface of the STI region.*

*38. The device of claim 35, wherein the first dislocation plane extends under a gate spacer adjacent the gate structure.*

*39. The device of claim 35, wherein a height of the plurality of fins in the first source/drain region and the second source/drain region is less than a height of plurality of fins under the gate structure.*

*40. The device of claim 39, wherein the STI region extends between the plurality of fins in the first source/drain region and the second source/drain region.*

* * * * *